United States Patent
Hasnain et al.

(10) Patent No.: US 11,356,133 B1
(45) Date of Patent: Jun. 7, 2022

(54) METHODS AND SYSTEMS FOR FILTER FREQUENCY RESPONSE SHIFT COMPENSATION FOR WLAN TRAFFIC

(71) Applicant: HEWLETT PACKARD ENTERPRISE DEVELOPMENT LP, Houston, TX (US)

(72) Inventors: Farhan Hasnain, Santa Clara, CA (US); Nitin A. Changlani, Santa Clara, CA (US); Eldad Perahia, Park City, UT (US); Deven Patel, Santa Clara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 17/245,967

(22) Filed: Apr. 30, 2021

(51) Int. Cl.
*H04B 1/04* (2006.01)
*H03F 1/32* (2006.01)
(Continued)

(52) U.S. Cl.
CPC ......... *H04B 1/0475* (2013.01); *H03F 1/3241* (2013.01); *H03H 17/06* (2013.01); *H04L 25/022* (2013.01); *H03F 2200/451* (2013.01)

(58) Field of Classification Search
CPC .... H03F 1/32; H03F 1/3241; H03F 2200/451; H03H 17/06; H04B 1/0458;
(Continued)

(56) References Cited

U.S. PATENT DOCUMENTS 8,294,605 B1   10/2012  Pagnanelli
8,493,907 B2   7/2013   Xie et al.
(Continued)

OTHER PUBLICATIONS

Agrawal, A.V., et al., RFPA Nonlinearity Compensation with MIMO Diversity for Indoor Channels, (Research Paper), 2018 5th IEEE Uttar Pradesh Section International Conference on Electrical, Electronics and Computer Engineering (UPCON), Nov. 2-4, 2018, 5 pgs., IEEE.

(Continued)

*Primary Examiner* — Young T. Tse
(74) *Attorney, Agent, or Firm* — Sheppard Mullin Richter & Hampton LLP

(57) ABSTRACT

Systems and techniques are described that are directed to filter frequency response shift compensation, including attenuation compensation. Attenuation compensation can apply a pre-distortion to compensate for the magnitude of attenuated resource units (RUs). Additionally, filter frequency response shift can involve applying PHY Protocol Data Unit (PPDU) scheduling schemes. For example, a PPDU scheduling scheme can reduce bandwidth in the channel, thereby dropping the affected RUs. The attenuation compensation is implemented using front ends that provide feedback to a respective radio, which allows that radio to apply the appropriate pre-distortion. The front end can include one or more filters enabling frequency domain coexistence between collocated radios operating in the differing Wi-Fi bands, and a coupler that provides the feedback indicating the frequency response shift to a radio. The radio then applying a digital pre-distortion to a signal input into the one or more filters to compensate for the attenuated RUs.

20 Claims, 9 Drawing Sheets

(51) Int. Cl.
*H03H 17/06* (2006.01)
*H04L 25/02* (2006.01)

(58) Field of Classification Search
CPC ............. H04B 1/0475; H04B 7/0617; H04B 2001/0408; H04L 25/022; H04L 25/03114; H04L 25/03133; H04L 27/367; H04L 27/368
USPC ....... 375/259, 260, 262, 265, 285, 296, 297; 455/500, 501, 63.1, 63.13, 114.2, 114.3
See application file for complete search history.

(56) References Cited

U.S. PATENT DOCUMENTS

| | | | |
|---|---|---|---|
| 8,891,715 | B2 | 11/2014 | Aswamy et al. |
| 9,762,266 | B2 | 9/2017 | Weissman et al. |
| 10,469,109 | B2 | 11/2019 | Gutman et al. |
| 10,998,615 | B1* | 5/2021 | van Erven ............... G06F 3/167 |
| 2012/0044919 | A1* | 2/2012 | Medapalli ............. H04W 88/06 370/338 |
| 2016/0380681 | A1* | 12/2016 | Sahota ..................... H04B 1/44 375/267 |
| 2020/0067548 | A1* | 2/2020 | Raghavan ............ H04B 1/3833 |
| 2020/0228159 | A1* | 7/2020 | Raghavan ............ H04L 5/1461 |
| 2021/0289500 | A1* | 9/2021 | Yang ................. H04W 72/0453 |

OTHER PUBLICATIONS

Hu, Y., et al., The Digital Front End with Dual-box Digital Pre-Distortion in All-Digital Quadrature Transmitter, (Research Paper), 2019 IEEE 13th International Conference on ASIC (ASICON), Oct. 29-Nov. 1, 2019, 4 pgs., IEEE.

\* cited by examiner

METHODS AND SYSTEMS FOR FILTER FREQUENCY RESPONSE SHIFT COMPENSATION FOR WLAN TRAFFIC

DESCRIPTION OF RELATED ART

The Unlicensed National Information Infrastructure (U-NII) radio band is a part of the unlicensed radio frequency (RF) spectrum used by IEEE 802.11 devices and wireless internet service providers (ISPs) for Wi-Fi communications. Currently, U-NII allocates Wi-Fi channels in the 5 GHz band across four sub-bands: U-NII-1 (5.150 to 5.250 GHz), U-NII-2 (5.250 GHz to 5.725 GHz), U-NII-3 (5.725 GHz to 5.850 GHz), and U-NII-4 (5.850 GHz to 5.925 GHz).

Recently, there have been efforts to include the 6 GHz band for Wi-Fi communications. For instance, it has been proposed to allocate Wi-Fi channels in the 6 GHz U-NII radio band across four sub-bands: U-NII-5 (5.945 to 6.425 GHz), U-NII-6 (6.425 GHz to 6.525 GHz), U-NII-7 (6.525 GHz to 6.875 GHz), and U-NII-8 (6.875 GHz to 7.125 GHz). Such channel allocation in the 6 GHz band would greatly increase the number of available channels for Wi-Fi communications, especially as currently available Wi-Fi bands (e.g., 2.4 GHz, 5 GHz) become increasingly congested from usage by ISPs and wireless local area networks (WLANs). Moreover, such channel allocation in the 6 GHz band brings the possibility of higher aggregated throughput across all Wi-Fi bands.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
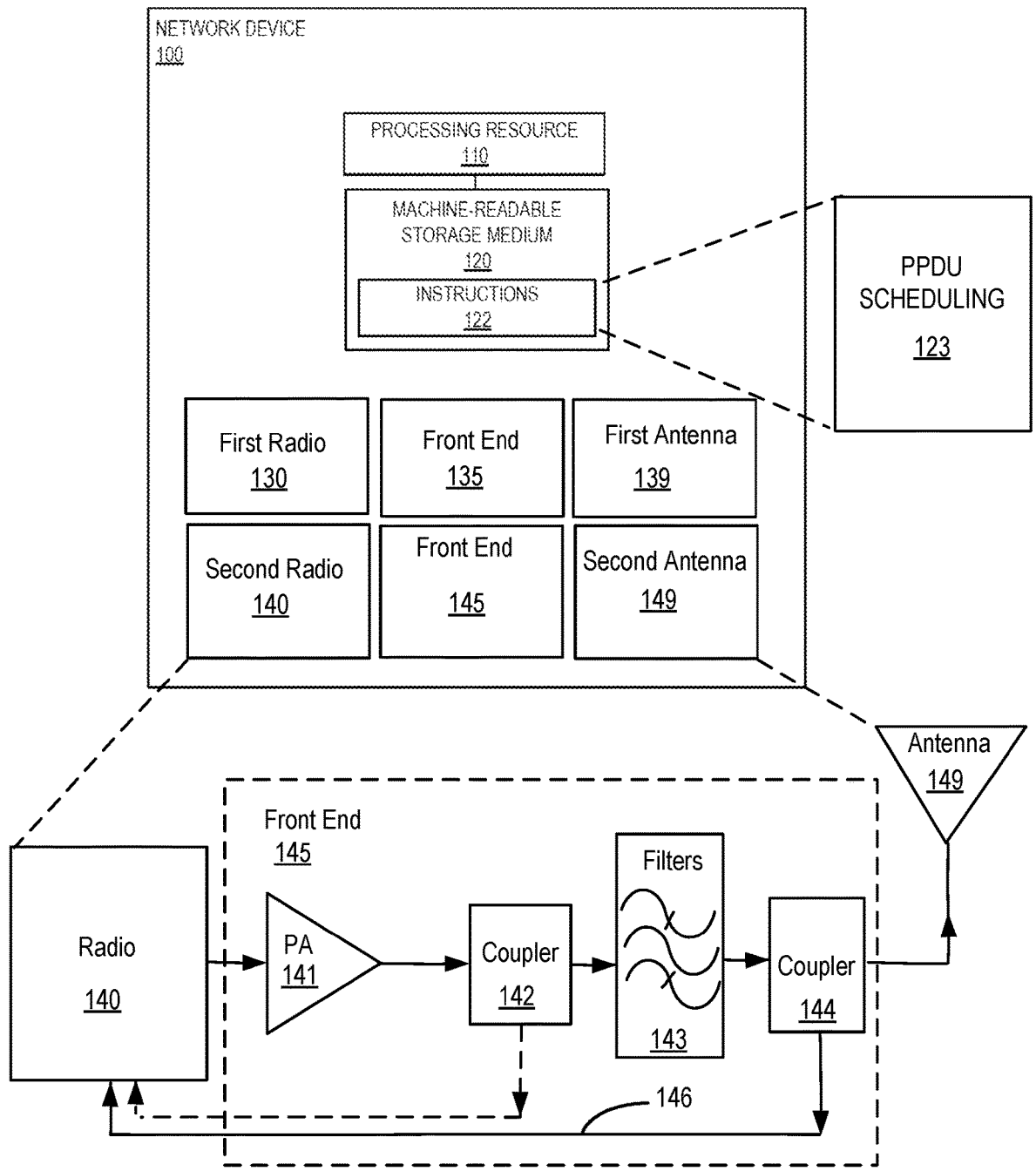
FIG. 1 is a block diagram of an example network device including collocated radios (e.g., operating in 5 GHz and 6 GHz Wi-Fi bands) and circuitry for filter frequency response shift compensation, according to some embodiments.

The figures are not exhaustive and do not limit the present disclosure to the precise form disclosed.

DETAILED DESCRIPTION

WLAN (wireless local area network) channels are frequently accessed using IEEE 802.11 protocols in accordance with Wi-Fi technology standard. Other equipment may also access the same channels, such as Bluetooth. The radio frequency (RF) spectrum is vital for wireless communications infrastructure. As background, the legacy 802.11 protocol standards include distinct radio frequency ranges for use in Wi-Fi communications, which include: 900 MHz, 2.4 GHz, 3.6 GHz, 4.9 GHz, 5 GHz, 5.9 GHz and 60 GHz bands. Each of the frequency ranges can be divided into multiple channels. These channels can be numbered at 5 MHz spacing within a band (except in the 60 GHz band, where they are 2.16 GHz apart), and the number refers to the center frequency of the channel. Although channels are numbered at 5 MHz spacing, transmitters generally occupy at least 20 MHz, and standards allow for channels to be bonded together to form wider channels for higher throughput. Those are also numbered by the center frequency of the bonded group.

With the ever-increasing number of radio technologies contending for spectrum within the Wi-Fi frequency ranges, collocated radios have to use various techniques that allow for simultaneous operation (coexistence) to avoid interference issues. In some cases, collocated radios can operate on different radio technologies and their spectrums may (or may not) overlap. In other instances, collocated radios can also operate on the same radio technology and their spectrums may (or may not) overlap. By applying a technique referred to herein as frequency domain coexistence (utilizing collocated radios), a network device can simultaneously operate both a 5 GHz radio using the 5 GHz U-NII channel allocation and a 6 GHz radio using the proposed U-NII 6 GHz channel allocation. This frequency domain coexistence technique has the advantage of operating multiple channels, each of which could be on neighboring bands. In other words, unrestricted simultaneous operation in both bands can be achieved.

Despite the advantages of the frequency domain coexistence, collocated radios typically require a significant bandgap between their respective spectrums to operate. This technique relies on use of filters (analog/digital) to keep the radios from interfering with each other. However, if the bandgap is too narrow, which may be the case for collocated radios operating in the 5 GHz and 6 GHz Wi-Fi bands, frequency domain coexistence may become very difficult to achieve.

In order to address the issues associated with frequency domain coexistence solution the disclosed filter frequency response shift compensation techniques can involve applying a pre-distortion to an affected channel in order to compensate for the magnitude of attenuated resource units (RUs) or orthogonal frequency-division multiplexing (OFDM) sub-carriers. This approach is referred to hereinafter as "attenuation compensation." Additionally, the filter frequency response shift compensation techniques can involve applying one or more PHY Protocol Data Unit (PPDU) scheduling schemes in a manner that compensates for any impact the shift may have on the performance of the wireless channels. For example, a PPDU scheduling scheme may involve reducing the bandwidth of a channel by de-weighing (or dropping) attenuated RUs (or sub-carriers) as a fail-safe (e.g., applied in instances when the attenuation compensation does not successfully compensate for the attenuation). This approach is referred to hereinafter as "PPDU scheduling." Some of the PPDU scheduling schemes have associated performance trade-offs, where some throughput may be lost by applying the scheme in favor of still being able to utilize the rest of the channel bandwidth. As will be described in detail, the filter frequency response shift compensation techniques may be implemented using different mechanisms. For instance, the attenuation compensation aspects may be implemented via dedicated digital pre-distortion (DPD) circuitry or implemented via PPDU scheduling. For example, a network device can be adapted to include a font end that is particularly designed such that a pre-distorted signal is fed through the filter in a manner that compensates for attenuation of some RUs in the passband which helps to gain back power on impacted RUs. As will be described in detail, the attenuation of RUs may be caused by the unintended shift in a filter frequency response As will be described in greater detail, in reference to FIG. 2 for example, unintended shifts in a filter's frequency response may be experienced as a result of filters having the fundamental characteristic of temperature-sensitive frequency responses (e.g., a filter's response will shift by X MHz for every Y° C. change in temperature). Accordingly, examples of the techniques and systems described herein may effectively mitigate this undesirable shift in the filter frequency response (without requiring that the filter's temperature be stabilized), which can potentially cause the channels in the Wi-Fi bands to degrade.

For purposes of discussion, the disclosed filter frequency response shift compensation techniques are described in reference to coexistence specifically with respect to 5 GHz and 6 GHz radios, for example the collocated radios 130 and 132 within the network device 100 shown in FIG. 1. Nonetheless, it should be appreciated that the disclosed filter frequency response shift compensation techniques are applicable to filters used for various types of radio technologies (and not limited to the Wi-Fi technologies, as described herein) that are operating in various different frequency spectrums (and not limited to 5 GHz and 6 GHz bands, as described herein).

Referring now to the drawings, FIG. 1 is a block diagram of an example network device 100 for continuous 5 GHz and 6 GHz operation and implementing the disclosed filter frequency response shift compensation techniques. Network device 100 includes at least one processing resource 110 and at least one machine-readable medium 120 comprising (e.g., encoded with) at least instructions 122 that are executable by the at least one processing resource 110 of network device 100 to implement functionalities described herein in relation to instructions 122. FIG. 1 serves to illustrate that the network device 100 is configured to include instructions 122 which particularly implements functionality for the PPDU scheduling 123 scheme, as disclosed herein. Accordingly, the network device 100 is programed to perform the PPDU scheduling aspects of the filter frequency response shift compensation techniques. The specific operations of the disclosed PPDU scheduling scheme are discussed in greater detail below in reference to FIG. 3 below.

In the example of FIG. 1, network device 100 may engage in any network data transmission operations, including, but not limited to, switching, routing, bridging, or a combination thereof. In some examples, network device 100 may comprise a wireless access point (WAP). In examples described herein, a "WAP" generally refers to receiving points for any known or convenient wireless access technology which may later become known. Specifically, the term WAP is not intended to be limited to WAPs which conform to IEEE 802.11 standards. A WAP generally functions as an electronic device that is adapted to allow wireless devices to connect to a wired network via various communications standards. A WAP may include any necessary hardware components to perform the inventions disclosed herein, including, but not limited to: processors, memories, display devices, input devices, communications equipment, etc. It will be understood by one of ordinary skill in the art that network device 100 may be any suitable type(s) of network devices made by any suitable manufacturer(s).

In the example of FIG. 1, network device 100 includes a first radio 130 and a second radio 140. In some examples, each of first radio 130 and second radio 140 may operate at one or more frequency bands which conform to one or more IEEE standards (e.g., 802.11ax). In some examples, first radio 130 may operate at one or more channels in the 5 GHz band. For instance, first radio 130 may operate at one or more channels across the U-NII-1, U-NII-2, U-NII-3, and U-NII-4 sub-bands. In some examples, second radio 140 may operate at one or more channels in the 6 GHz band. For instance, second radio 140 may operate at one or more channels across the proposed U-NII-5, U-NII-6, U-NII-7, and U-NII-8 sub-bands. It will be understood by one skilled in the art that first radio 130 and second radio 140 may operate at any suitable frequency band(s) and conform to any suitable type(s) of wireless communication standards, now known and later developed (e.g., in accordance with future and/or emerging Wi-Fi standards). Moreover, although FIG. 1 shows network device 100 comprising two radios, it will be understood by one skilled in the art that network device 100 may comprise four, eight, or any suitable number of radios.

In the example of FIG. 1, network device includes a first antenna 139 and a second antenna 149. In some examples, each of first antenna 139 and second antenna 149 may transmit and/or receive directional signals, omnidirectional signals, or a combination thereof. In examples described herein, a "directional" signal refers to a signal which radiates more strongly in one or more directions as compared to one or more other directions along an azimuth plane (i.e., horizontal plane), whereas an "omnidirectional" signal refers to a signal which radiates equally in all directions along an azimuth plane. In some examples, each of first antenna 139 and second antenna 149 may comprise a phased array antenna. In examples described herein, a "phased array antenna" refers to an array of antennas which can create a directional signal which can be electronically steered to point in different directions without moving the antennas. In such examples, a phased array antenna may comprise an array of directional and/or omnidirectional antennas which can focus RF energy towards specific spatial directions. It will be understood by on skilled in the art that first antenna 139 and second antenna 149 may comprise any suitable type(s) of antenna, now known and later developed. Moreover, although FIG. 1 shows network device 100 comprising two antennas, it will be understood by one skilled in the art that network device 100 may comprise four, eight, or any suitable number of antennas.

As previously described, a radio operating in the 6 GHz band, for instance the second radio 140, can offer great potential for increasing channel availability and throughput for Wi-Fi communications. Nonetheless, as alluded to above, Wi-Fi channel allocation in the 6 GHz band could have a narrow bandgap between Wi-Fi channel in the 5 GHz band, thereby potentially creating co-existence issues with existing 5 GHz Wi-Fi channels. As an example, in operation, the network device 110 may simultaneously use the first radio 130 to operate in the 5 GHz band using the 5 GHz U-NII channel allocation and the second radio 140 to operate in the 6 GHz radio band using the proposed U-NII 6 GHz channel allocation. However, frequency domain coexistence must be effectively implemented such that the first radio 130 and the second radio 140 have the benefits of co-operation, without jamming and interference occurring for certain Wi-Fi channels due to the narrow bandgap that exists between the 5 GHz and 6 GHz bands.

Specifically, when the network device 100 receives a signal in a Wi-Fi channel at or near an upper bound of the 5 GHz band while generating another signal in a Wi-Fi channel at or near a lower bound of the 6 GHz band (or alternatively, when the network device 100 receives a signal in a Wi-Fi channel at or near a lower bound of the 6 GHz band while generating another signal in a Wi-Fi channel at or near an upper bound of the 5 GHz band), the received signal may experience jamming and interference from the generated signal, thereby resulting in de-sensitization (e.g., shorter coverage range) and signal quality degradation (e.g., lower throughput) of the received signal. The issues associated with coexistence may be further aggravated when the passband of interfering bands are very wide (for example, >500 MHz) as filter design becomes very complicated. To achieve frequency domain coexistence, some existing RF filtering technologies require a wide transition bandwidth (e.g., 250 MHz or more) between passband filters for 5 GHz and 6 GHz bands to achieve a minimum dB rejection (e.g., at least 50 dB) that is required to mitigate such jamming and interference. As an enhancement over these existing RF filtering technologies, the network device 100 is distinctly designed to adequately address 5 GHz and 6 GHz Wi-Fi channel co-existence issues, even when only narrow transition bandwidth (e.g., 50 or 110 MHz) is available between Wi-Fi channels at or near the bounds of the 5 GHz and 6 GHz bands. According to the embodiments, the network device 100 includes front ends 135, 145 having an enhanced design that is configured to: 1) ensure proper frequency domain coexistence between the respective spectrums of the collocated first radio 130 and the second radio 140; and 2) provide feedback to its respective radio 130, 140 in order to apply proper pre-distortion to compensate for a detected frequency response shift. As seen in FIG. 1, each of the radios 130, 140 has a dedicated front end 135, 145 respectively. In the example, radio 130 utilizes front end 135, and radio 140 utilizes front end 145. FIG. 1 only shows an example configuration for the internal circuitry of front end 145 for purposes of illustration. However, it should be appreciated that front end 135 can have the same, or substantially similar, configuration for its internal circuitry.

FIG. 1 illustrates the example configuration for internal circuitry of front end 145 (represented by dashed line box) with respect to its connection to the second radio 140 and the second antenna 149. In particular, the filters 143 of the front end 145 operate in manner that is fine-tuned and precise, especially for the narrow sub-band, and can achieve very high rejection in the narrow bandgap. However, there is a trade-off for utilizing such sophisticated filters 143 (e.g., narrowband filter) to keep the first radio 130 and the second radio 140 from interfering with each other in a manner that sustains frequency domain coexistence for narrow bandgaps (e.g., 5 GHz and the 6 GHz Wi-Fi bands). Narrowband filters, such as filters 143, typically have a filter characteristic of being very sensitive to temperature changes. For example, the edges of the passband of filters 143 can experience shift in range between 3 MHz-5 MHz (left or right) on the frequency spectrum as the temperature changes (e.g., from hot/high temperature to cold/low temperature). This shift in the filters' 143 frequency response can attenuate some RUs or OFDM sub-carriers in the range of 6 dB-10 dB and thereby can ultimately lead to high Error Vector Magnitude (EVM) issues. As a result, an entire affected channel may become completely unusable (due to degradation). For instance, even though coexistence is supported, attenuation in the passband of the filters 143 (due to temperature-sensitivity induced frequency response shift) could cause a complete loss of channels having 20 MHz, 40 MHz, 80 MHz, 160 MHz or 320 MHz width, and further affecting the overall performance of the network device 100. To address these issues related to temperature-sensitivity induced frequency response shift that may be experienced at the filters 143, the front end 145 is even further enhanced to provide feedback to support digital pre-distortion capabilities within the first radio 130, and second radio 140 in order to achieve attenuation compensation.

Figure 2A:
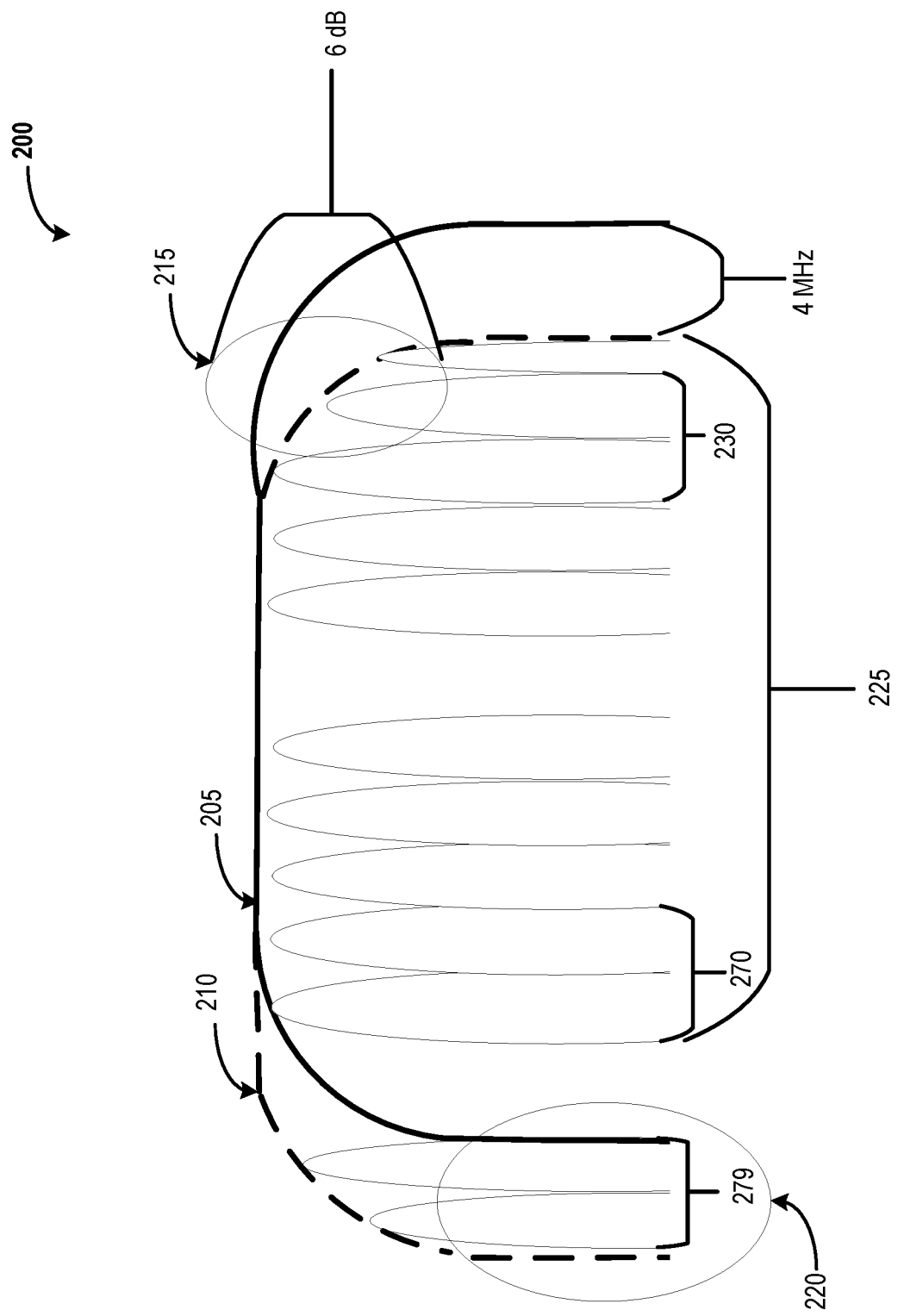
FIG. 2A is a graph illustrating attenuation of Orthogonal Frequency-Division Multiple Access (OFDMA) resource units (RUs) in a passband of a filter in the network device if FIG. 1 due to temperature-sensitivity of the filter, according to some embodiments.

Referring now to FIG. 2A, a graph 200 illustrates an example of attenuation in a passband that may be experienced by narrowband filters (such as filters 143 shown in FIG. 1), as temperature changes during operation. As previously described, narrowband filters may be characteristically susceptible to response shifts due to temperature swings. According to the embodiments, the narrowband filters are designed specifically to cater to 160 MHz channels at the upper edge of 5 GHz and lower edge of 6 GHz bands. However, significant shifts in filter response can render these channels unusable for full bandwidth operation. As background, Temperature Coefficient of Frequency (TCF) is the fundamental characteristic of filters that gauges the shift in filter response over frequency. TCF can be expressed in parts per million per degree Celsius (PPM/° C.). For example, a TCF of 25 PPM/° C. at 6000 MHz indicates that a filter's response can shift by 0.15 MHz for every ° C. change in temperature. In an example, a nominal operating temperature range of filters can be from −40° C. to 100° C. with a nominal operating temperature of about 20° C. If the filter is designed to be centered at 20° C., there may be a possible 60° C. of temperature swing on either side, which can potentially amount to a shift in filter response in the frequency spectrum by 9 MHz. Filters that commonly use high Q technologies today like SAW (Surface Acoustic Wave), BAW (Bulk Acoustic Wave) and DR (Dielectric cavity Resonance) all have TCFs in the range of 20-40 PPM/° C. This means over temperature, these filters' response can shift anywhere from 7-15 MHz at 6000 MHz. In particular, the graph 200 illustrates two conditions that can result from a temperature-sensitivity (or TCF) based shift in a filter's response: 1) attenuation in the passband (indicated by oval 215); and 2) shifting of the rejection band (indicated by oval 220).

In detail, FIG. 2A illustrates a scenario where the narrowband filter (shown in FIG. 1) may experience an increase in temperature by 27° C. For example, as the network device (shown in FIG. 1) operates, the various electrical components may emit heat, which in turn, heats the environment inside of the device. Because the filter is an internal component of the network device, it may similarly experience a heat-up. Furthermore, as alluded to above, the filter can have a TCF of 25 PPM/° C. at 6000 MHz. The graph 200 illustrates an intrinsic passband 205 of the filter, or the passband related to the filter's intended response by design (e.g., nominal operations). Additionally, graph 200 shows a temperature-sensitivity affected passband 210 (indicated by dashed line), where the filter's response has been shifted (e.g., deviation from the intended response by design) as a result of the increase in temperature and the filter's temperature-sensitivity. As seen, the graph 200 shows that the filter's response due to the rise in temperature (+27° C.), or the temperature-sensitivity affected passband 210 has shifted to the left on the frequency spectrum by about 4 MHz (with respect to the position of the intrinsic passband 205). In general, this 4 MHz shift occurring in the temperature-sensitivity affected passband 210 has caused the attenuation on the right side of the graph 200 (indication by oval 215), and shifting of the rejection band (indicated by oval 220) on the left side of the graph 200. In the temperature-sensitivity affected passband 210, the OFDMA RUs 230 have experienced attenuation. This is illustrated by the reduction of the amplitude of the signal, or "shortening" of the two RUs 230 to the farthest right of the graph 200, as compared to rest of the OFDMA RUs 225 of the graph 200. Particularly, the graph 200 shows that the affected two RUs 230 from the RUs 225 in the passband 210 having up to a 6 dB attenuation. A large attenuation in the RUs, such as the 3 dB-6 dB of attenuation shown in the affected RUs 230 of FIG. 2, can be potentially catastrophic, degrading the reliability and quality of the channels. For instance, one 26-tone RU from the RUs 225, can be approximately ~2 MHz wide and can have 1024-QAM modulated sub-carriers, carrying approximately 260 bits. Thus, without applying the disclosed DPD technique to compensate for this shift, the RUs 225 could potentially experience significant attenuation at high temperature, which ultimately leads to high EVM.

Figure 4:
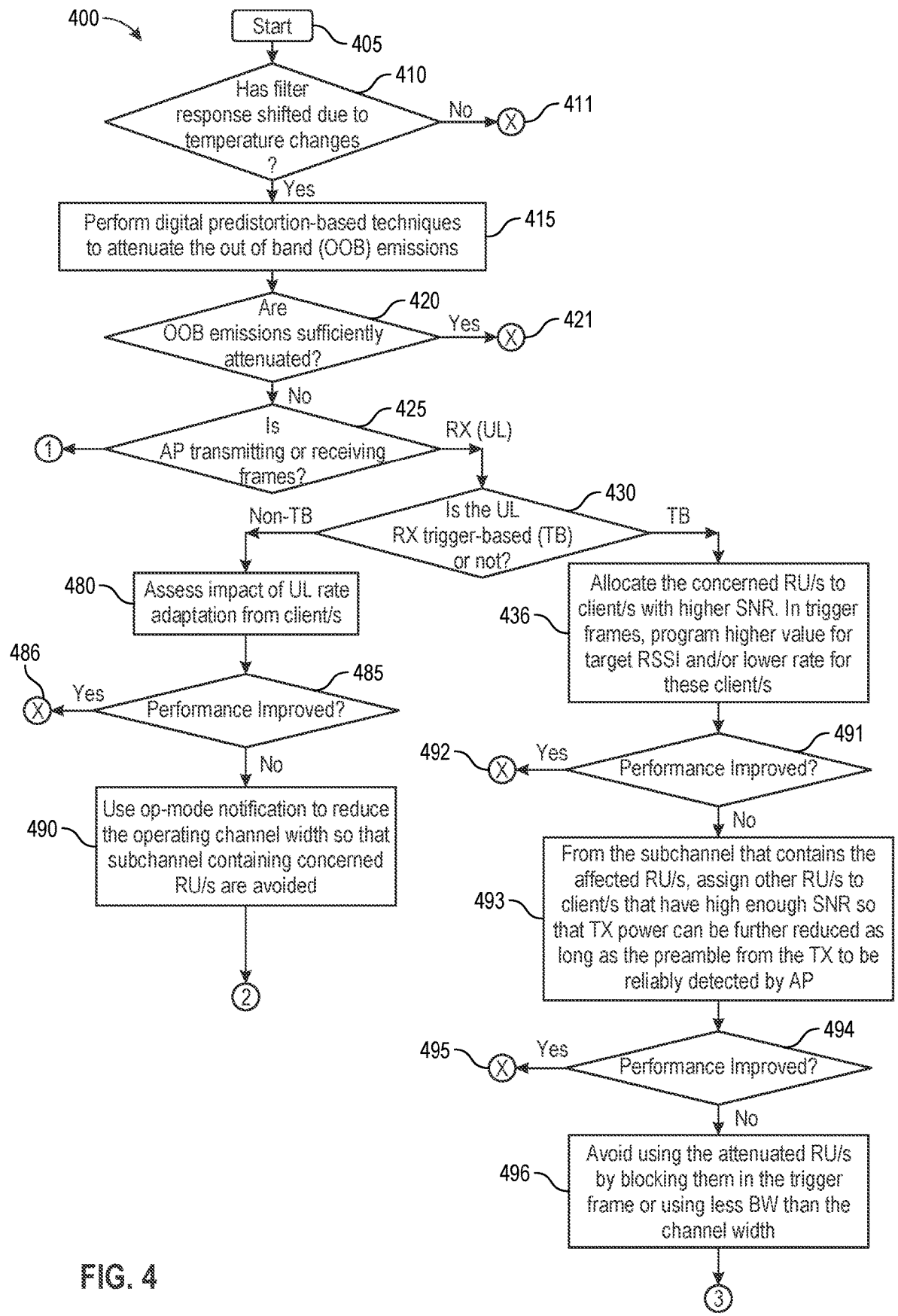
FIG. 4 is a flow chart to illustrate a process for filter frequency response compensation including digital pre-distortion and PHY Protocol Data Unit (PPDU) scheduling schemes to address shift of the rejection band, according to some embodiments.
Figure 4:
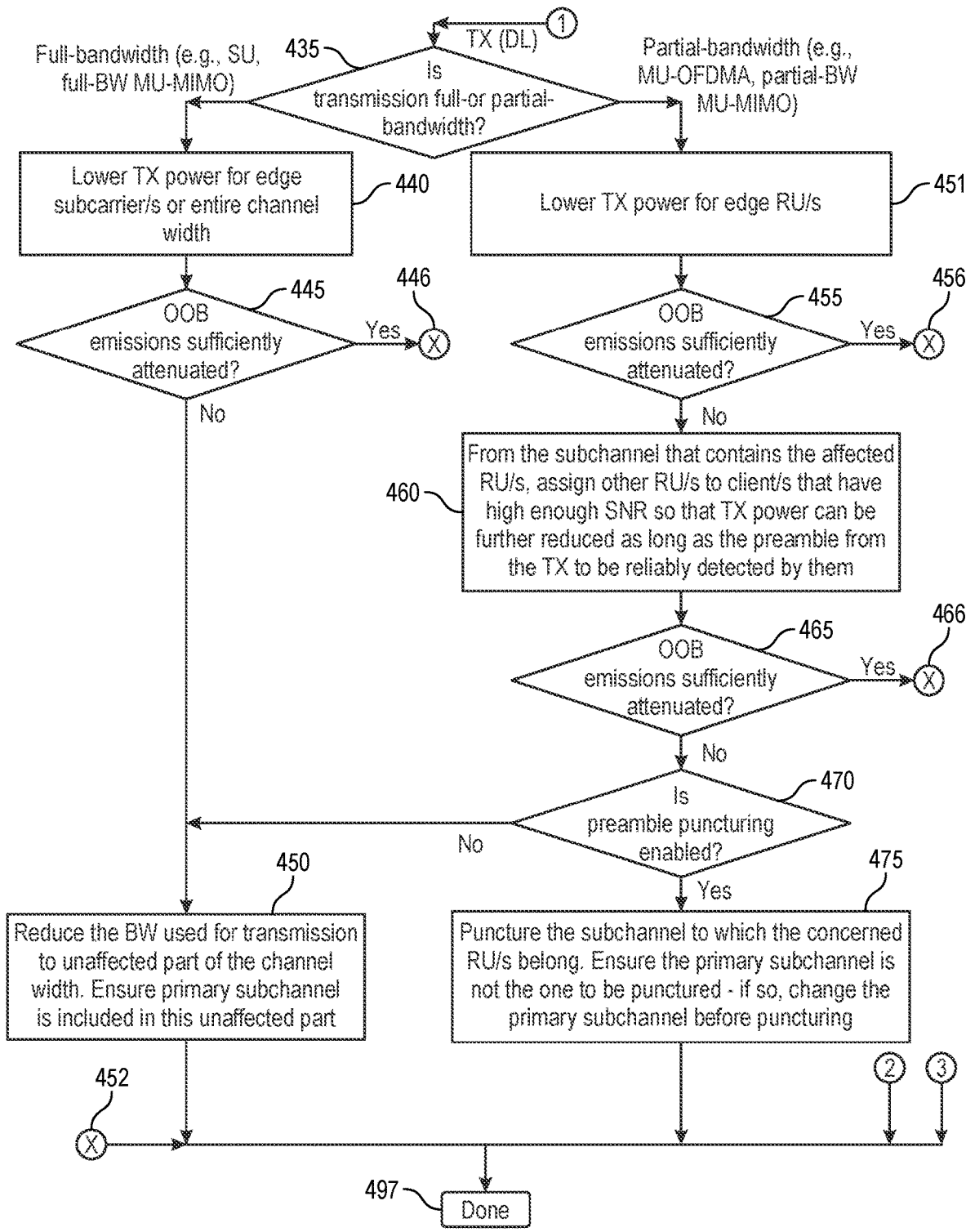

Also, graph 200 illustrates shifting of the rejection band (indicated by oval 220). This shift can potentially cause desensitization issues in a simultaneously operating adjacent channel. The impact of such shifting in the rejection band can cause a reduced range of the affected channel. For example, if the 160 MHz channel 15 (in UNII-5) filter undergoes such a response shift as shown in FIG. 2A, it may potentially de-sensitize the 160 MHz channel 163 (in UNII-3/4). That is, if channels 163 and 15 are operating simultaneously on an WAP, this issue will reduce the range of channel 163 operation to clients. According to some embodiments, the front end circuitry and PPDU scheduling techniques as disclosed herein can be applied in a manner that specifically compensates for the shifting of the rejection band that can also occur as a result of the filter's temperature-sensitivity. A method that is particularly employed for compensating for this unintended shift of the rejection band (in the frequency response of the narrowband filter) is shown in FIG. 4. In addition to compensating for "shifting of the rejection band", these techniques will also help with achieving very strict OOB (Out-Of-Band) rejection requirements in the gap between UNII-4 and UNII-5 bands.

Referring back to FIG. 1, the front ends 135, 145 can be configured such that a feedback signal is generated to allow the radios 130, 140 to compensate for the attenuation experienced by RUs (as shown in FIG. 2A. Generally, the internal circuitry for the front ends 135, 145 extends the linear gain region of the Power Amplifier (PA) 141 by pre-distorting the baseband signal. The front ends 135, 145 can be designed in accordance with an algorithm relating to a digital pre-distortion scheme that is trained about the distortion in phase and magnitude of a Power Amplifier (PA) output near compression. The algorithm can undergo pre-processing, where the algorithm is trained on the PA behavior. Thereafter, during processing, the DPD algorithm can determine a pre-distortion that can be applied to the baseband signal such that after going through PA distortion (RF amplification), the signal is shaped as a linearly amplified signal at PA output. Particularly, the front ends 135, 145 can be configured to apply an appropriate amount of distortion to a signal that is needed to compensate for an attenuation of the filter's response. That is, the front ends 135, 145 distort a signal prior to filtering, thereby boosting the signal such that any attenuation (learned by the algorithm) at the filter's response is nullified.

In the example configuration, the front end 145 is shown to internally include a first coupler 142 (also referred to herein as the pre-filter coupler), which is connected in series to an output of the PA 141. Furthermore, the front end 145 includes a second coupler 144 (also referred to herein as the post-filter coupler). The second coupler 144 is connected to the output of the filters 143, being particularly positioned to receive the response of the filters 143. The second coupler 144 feeds back the RU attenuation to the radio 140 via a feedback line 146, where the radio 140 then performs DPD. As a result, a type of "feedback loop" is formed in the shown configuration between the filters 143, the post-filter coupler 144, and the radio 140. The signal that is received by the second coupler 144, as a response from the filters 143, is fed back into the radio 140. In an alternate embodiment where the first coupler 144 is not present, DPD can still be performed using a pre-determined attenuation value based on a known temperature shift. In this case, the purpose of coupler 142 would be to perform Transmit Power Closed Loop Power Control (CLPC) and would not play a role in DPD active feedback.

Accordingly, based on the feedback signal from the second coupler, the DPD algorithm can determine whether the signal is experiencing attenuation (with respect to an intrinsic response), and subsequently that distortion needs to be applied. The first radio 140 can then be used to pre-distort the signal prior to it entering the filters 143 as a compensation for the attenuation. For instance, the first radio 140 can apply an amount of amplification to the signal that cancels out the amount of attenuation, and compensating for the filters' 143 shift in response.

Moreover, it should be understood that the internal circuitry of the front end 145 shown in FIG. 1 is not intended to be limiting and alternative configurations may be employed to implement the front end 145, according to the embodiments. For instance, as alluded to above, the coupler 142 may be used for RF CLPL, which is generally used on APs. According to this embodiment, a pre-determined attenuation value based on a known temperature shift can be used. Accordingly, in this alternate configuration, the second coupler 144 may not be required (or present) in the circuitry of the front end 145.

Figure 2B:
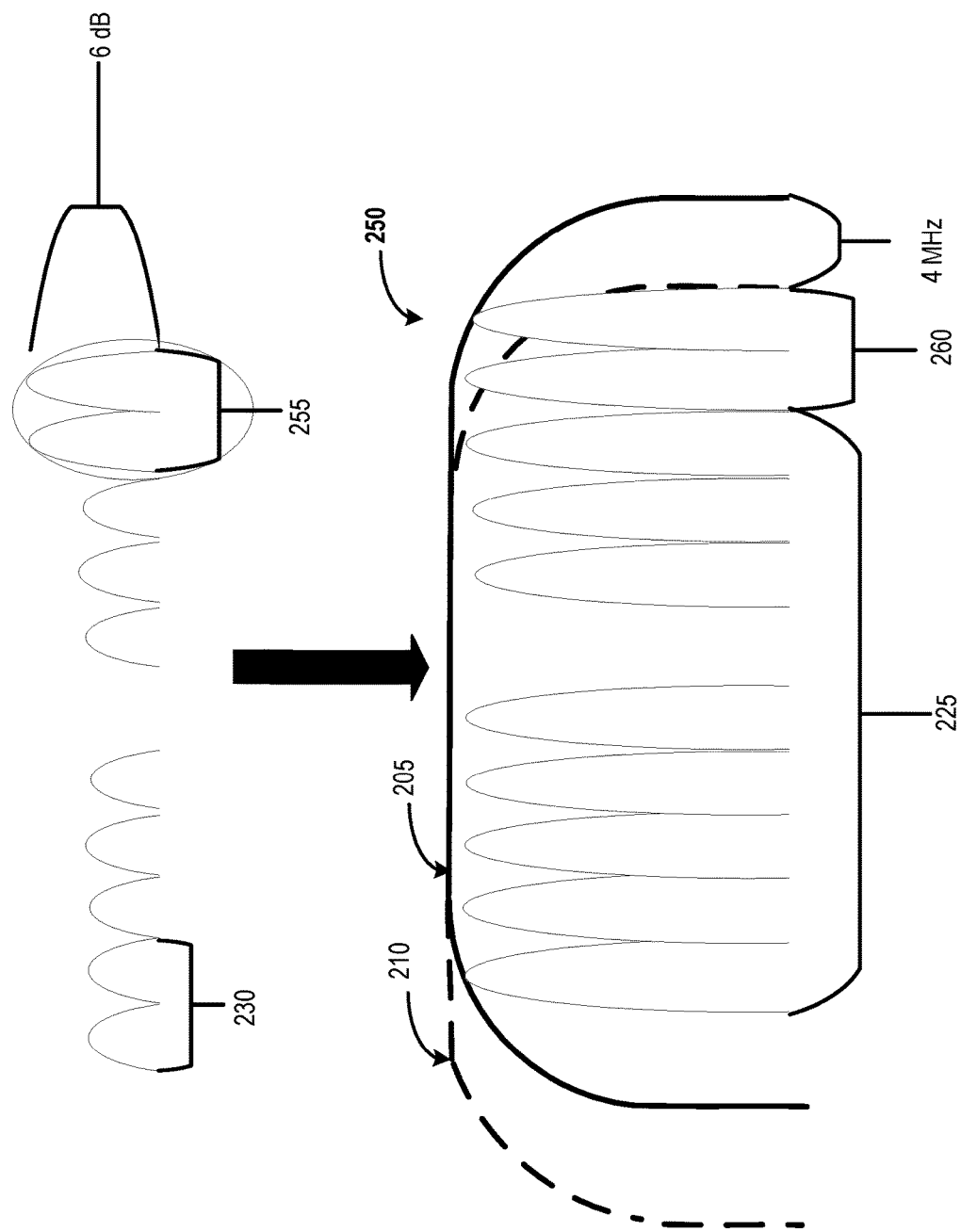
FIG. 2B is a graph illustrating applying the disclosed digital pre-distortion techniques to the affected OFDMA RUs in the passband shown in FIG. 2A, according to some embodiments.
Figure 3:
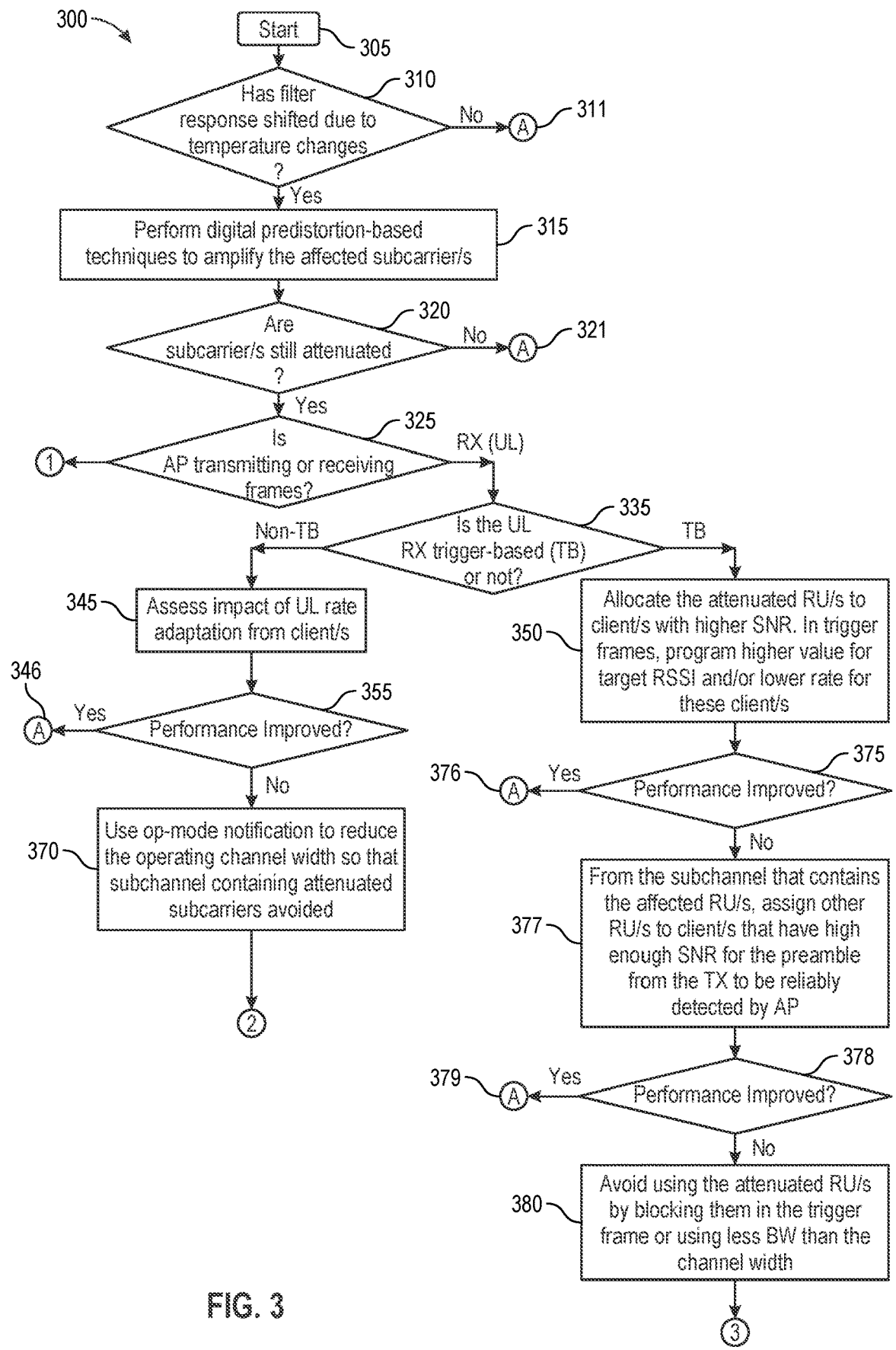
FIG. 3 is a flow chart to illustrate a process for filter frequency response compensation including digital pre-distortion and PHY Protocol Data Unit (PPDU) scheduling schemes to address attenuation of OFDMA RUs, according to some embodiments.
Figure 3:
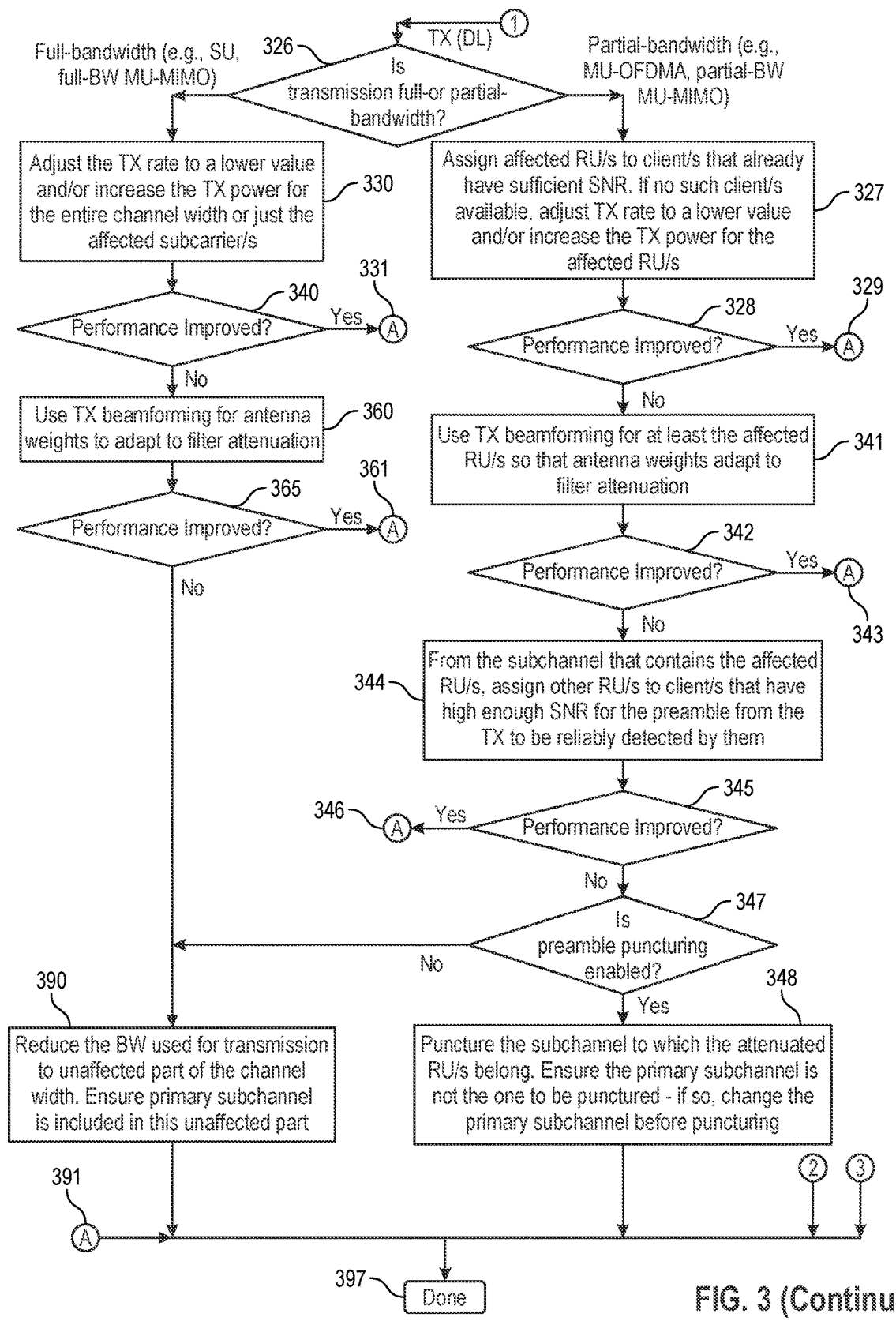

FIG. 2B refers back to the scenario illustrated by FIG. 2A. In detail, FIG. 2B serves to show that the front ends can be leveraged to enable each of the radios to pre-distort a signal in a manner that increases the amplitude of the affected RUs 255 by 6 dB. Accordingly, the sub-carriers of the last two RUs 255 in the baseband will be shifted up by 6 dB, or amplified by the radios, before the signal enters their respective filters. Consequently, the pre-distortion applied by the radios boosts the RUs 255 enough to compensate for the expected attenuation (over extreme temperatures) of the filter's response that has been observed to shift the RUs down by 6 dB. For instance, graph 250 illustrates that when the pre-distorted signal is filtered by the filters 143 (indicate by down arrow), the extra attenuation in the last two RUs 260 (due to the filter's temperature-sensitivity frequency response shift) will be nullified by the higher amplitude of the pre-distorted RUs 255 as input into the filters 143. As seen in graph 250, the last two RUs 260 (impacted by the filter's frequency response shift) are the same amplitude as the remaining RUs 225 (not impacted by the filter's frequency response shift) in the passband 210. Consequently, the radios can maintain low EVM of the RUs affected by attenuation, which preserves signal quality while the collocated radios 130, 140 are operating simultaneously in 5 GHz and 6 GHz. It should be understood that the disclosed DPD techniques ensure that only the affected RUs are distorted, or otherwise amplified for DPD. Thus, there is no impact on the RUs that are unaffected by attenuation in the passband which would cause the corresponding channels to be degraded by the DPD techniques. For instance, referring back to FIG. 2B, the unaffected RUs on the left side of the passband are not distorted. An example of a method to apply DPD and PPDU scheduling particularly to compensate for attenuation of the OFDMA RUs (as indicated by oval 215 in FIG. 2A) is shown in FIG. 3. Furthermore, the first coupler 142 can be used to extend the linear gain of the PA 141.

In some embodiments, the disclosed DPD and PPDU scheduling techniques can also be applied to compensate for other condition resulting from temperature-sensitivity induced frequency response shift associated with the narrowband filters 143. As discussed above in reference to FIG. 2A, the left side of the passband shows a shift in the rejection band (indicated by oval 220). According to the embodiments, the disclosed front ends 135, 145 (employed for implementing DPD) and the PPDU scheduling scheme 123 can be tuned in a way that targets compensation for the rejection band shift. As previously mentioned, an example of a method to apply DPD and PPDU scheduling particularly to compensate for shift in the rejection band (indicated by oval 220) is shown in FIG. 4.

Figure 2C:
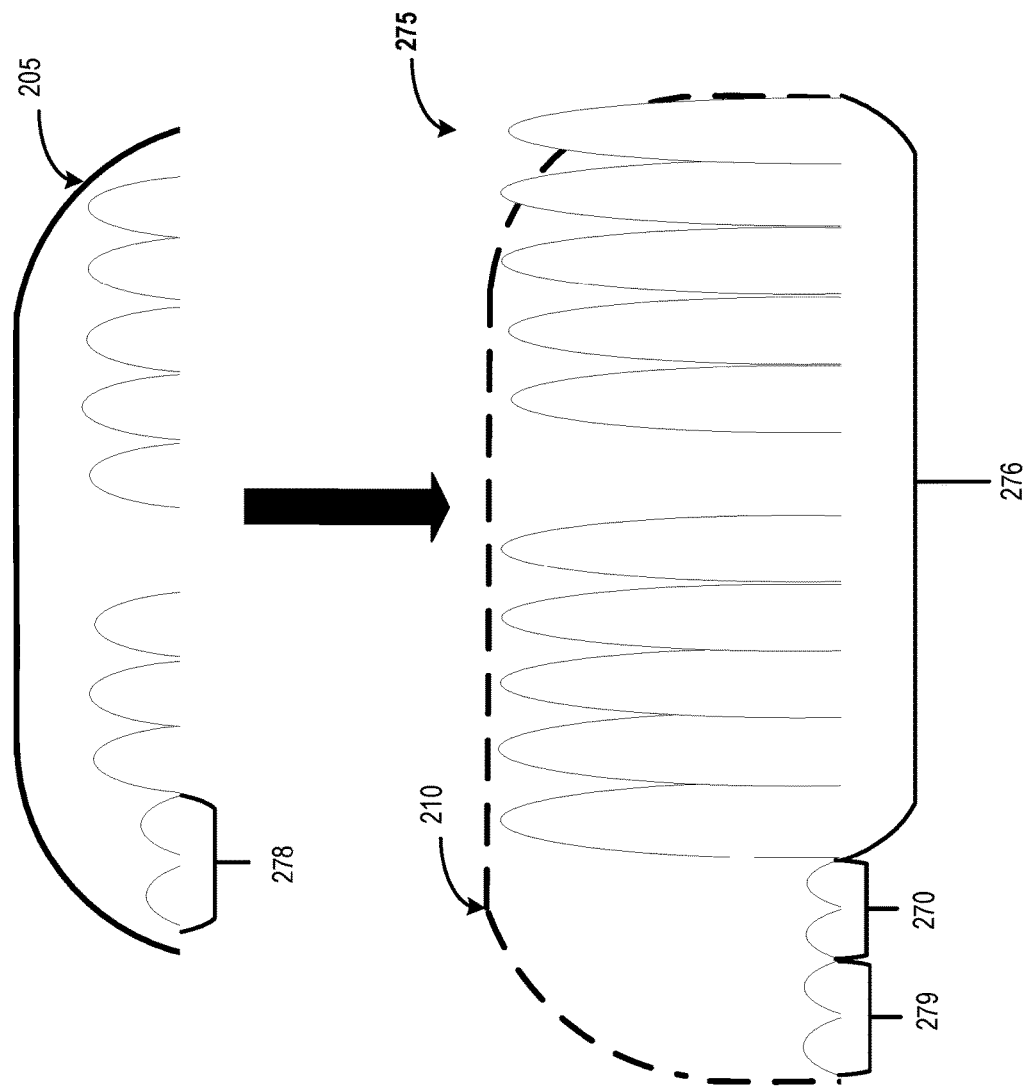
FIG. 2C is a graph illustrating applying the disclosed digital pre-distortion techniques to out of band (OOB) OFDMA RUs that may be emitted due to the shift of the rejection band shown in FIG. 2A, according to some embodiments.

FIG. 2C refers back to the scenario illustrated by FIG. 2A. In detail, FIG. 2C serves to show that the front ends can be leveraged to enable each of the radios to pre-distort a signal in a manner that decreases the amplitude of any out of band (OOB) RUs 270 to compensate for the shift of the rejection band. FIG. 2C illustrates that RUs 270 may be out of band for the intrinsic passband 205 of the designed filter. However, graph 275 illustrates that these OOB RUs 270 may still be emitted due to the shift of the rejection band 210 (e.g., RUs 270 being included in the passband that has experienced a shift). As seen in graph 270, by using pre-distortion to aggressively decreases the amplitude of the OOB RUs 270 that are in now within the shifted passband 210. With such a small amplitude (in relation to the other RUs 276), these OOB RUs 270 are essentially negligible and have less potential to substantively affect transmissions of a simultaneously operating channel outside of the intended rejection band. Thus, this DPD technique compensates for the shift in the rejection band. Furthermore, in the case of temperature decrease of the filters 143, an opposite temperature-sensitivity induced frequency response shift can be experienced. For example, if the filters 143 substantially cool-down, the impact can be described as the passband shifting to the right with respect to the intrinsic passband (e.g., the opposite direction of the passband shift shown in FIG. 2A). Accordingly, the front ends 135, 145 (employed for implementing DPD) and PPDU scheduling scheme 123 can be particularly configured to compensate for the opposing frequency response shift (e.g., passband right-shift), which may be more suitable when the network device 100 is anticipated to be in an operating environment with low temperatures. In some embodiments, the front ends 135, 145 can be configured to allow the radios to perform pre-distortion (aggressively amplify) on the affected RUs on the left side of the channel bandwidth for these instances of opposing frequency response shift (e.g., passband right-shift).

Now, the function of the filters 143 is described. As alluded to above, the filters 143 are distinctly designed for an enhanced operation that accommodates for the collocated radios 130, 140 such that frequency domain coexistence is maintained and interference is mitigated.

In the example of FIG. 1, instructions 122 of the network device 100 may be configured to receive a first signal in one of a 5 GHz band and a 6 GHz band. In some examples, the first signal may be received by first antenna 139 of network device 100. In the example of FIG. 1, instructions 122 of the network device 100 may be configured to generate a second signal in the other one of the 5 GHz and 6 GHz bands. In some examples, the second signal may be generated by second radio 140 of network device 100, wherein second radio 140 operates at the other one of the 5 GHz and 6 GHz bands.

In the example of FIG. 1, instructions 122 of the network device may be configured to select at least one of the filters 143 to be applied to the one of the first and second signals in the 5 GHz band. As an example, the filters 143 can be comprised of a plurality of filters where a second filter allows a higher frequency band to pass than a first filter in the 5 GHz band and the second filter is narrower than the first filter. In some examples, the first or second filter may be selected by the front end 145. In some examples, the first or second filter may be selected in response to instructions received by the network device 100 from a controller device. For instance, the instructions received by the network device 100 from the controller device may indicate a channel in the 5 GHz band which corresponds to one of the first or second filters, and the first or second filter may be selected in response to the indicated channel.

In some examples, the first filter from the filters 143 may allow a frequency band in the range of 5150 to 5735 MHz to pass, and the second filter may allow a frequency band in the range of 5735 to 5895 MHz to pass. It will be understood by one skilled in the art that the each of the filters 143 may allow different frequency bands to pass in the 5 GHz band, and that a plurality of Wi-Fi channels may correspond to each frequency band.

In some examples, the first filter may have a center frequency (i.e., a frequency at the center of the frequency band which the filter allows to pass) and a stop frequency (i.e., a frequency at a bound of the frequency band which the filter allows to pass) such that: $2\% \leq |((\text{Stop Frequency} - \text{Center Frequency}))/((\text{Center Frequency}))|*100 \leq 10\%$. In some examples, the second filter may allow a frequency band to pass which is larger than an integer multiple of channel bandwidth of a channel in the 5 GHz band. For instance, the channel may be a channel having the widest channel bandwidth among a plurality of channels in the 5 GHz band. In some examples, the second filter may have a center frequency and a stop frequency such that: $|((\text{Stop Frequency} - \text{Center Frequency}))/((\text{Center Frequency})) + *100 \leq 2\%$. As alluded to above, these filters 143 can be implemented as narrowband filters that are designed specifically for 160 MHz channels at the upper edge of 5 GHz and lower edge of 6 GHz bands, emphasizing the importance of appropriately compensating for shifts in the filter response which can otherwise render these channels unusable.

FIG. 3 is a flow chart to illustrate a process 300 the includes both the disclosed DPD techniques and PPDU scheduling. As previously described in reference to FIG. 1, the sophisticated filters used to maintain frequency domain coexistence in the 5 GHz band and 6 GHz band can be susceptible to temperature-sensitivity induced frequency response shift. PPDU scheduling is another approach (in addition to DPD) that can be used to correct, or otherwise compensate for the attenuation of RUs in the passband that may be caused by this shift. In some embodiments, the PPDU scheduling aspects of process 300 are employed as a form of failsafe, for instance if the radios apply DPD in a manner that is not able to provide enough compensation in instances of severe attenuation. The process 300 may be implemented by a network device, such as an AP, that includes collocated radios operating simultaneously in the 5 GHz band and 6 GHz band as shown in FIG. 1. Furthermore, the various operations of the process 300 may be implemented by a processor executing instructions stored on the network device, by the radios of the network device, or a combination thereof.

As shown in FIG. 3, the process 300 begins at operation 305. Subsequently, at operation 310, the PPDU scheduling process 300 can determine whether the filter response has shifted due to temperature changes. Detecting that there is temperature-sensitivity induced frequency response shift (shown as "Yes") can serve as an indication that there is some attenuation being experienced by some RUs, commonly by the RUs at the edges of the channel width. In some embodiments, there may be a known correspondence between an amount of temperature shift and an amount of attenuation. For example, a DPD algorithm can learn that a 27° C. temperature shift at the filter (on a filter with a TCF of 25 PPM/° C. at 6000 MHz) corresponds to a 6 dB attenuation. As a result, the DPD algorithm can determine an amount of pre-distortion that needs to be applied to appropriately compensate for that attenuation. Thereafter, the PPDU scheduling process 300 can move to operation 315 to perform DPD techniques to pre-amplify the affected RUs. The DPD techniques may be implemented via the radios (including front ends) described in detail above in reference to FIG. 1.

Alternatively, if operation 310 detects that there is no shifting in the filter's response (shown as "No"), then the process 300 can move to operation 311 and end the process 300, or return back to operation 305 to re-start the process in an iterative manner.

Continuing to operation 320, the process 300 can perform a check to determine whether the RUs are still attenuated, even after DPD techniques have been employed. When attenuation still exists even after pre-distorting the sub-carriers in the affected RUs (e.g., at the ends of the channel width), this may result in errors on the receiver while decoding the symbols corresponding to those sub-carriers. Errors in decoding may lead to subframe errors in the PPDU. That is, some MPDUs within the PPDU may not be properly received by the receiver (AP in the case of uplink (UL) traffic, or the client(s) in case of downlink (DL) traffic). For OFDMA frames, there could be a higher impact for stations that use such edge-RUs. Accordingly, upon determining that the affected RUs are still experiencing attenuation, the process 300 can continue to PPDU scheduling as a secondary approach (or failsafe) in order to correct for the filter's response shift that was not completely corrected by the DPD techniques.

Otherwise, if operation 310 determines that there is no attenuation in the RUs, then this determination indicates that the DPD techniques of previous operation 315 has successfully compensated for the temperature-sensitivity induced frequency response shift. Thus, the process 300 can move to operation 321 and end the process 300, or return back to operation 305 to re-start the process in an iterative manner.

Generally, operation 325 can be considered as the start of the PPDU scheduling functions of the process 300. The disclosed PPDU scheduling techniques can be configured to apply a particular scheme based on the direction of traffic (e.g., whether it is transmitted or received by the AP) and based on the type of PPDU used for the traffic (whether it is single user (SU) or multi-user (MU)). By adapting the scheme specifically for the traffic that is being communicated, the PPDU scheduling aspects of the process 300 can be used to optimize performance and ensure the most optimal utilization of the entire width of the channel. A particular scheme can be applied for: 1) downlink traffic, for PPDUs transmitted by the AP; and 2) uplink traffic, for PPDUs received by the AP. Thus, at operation 325 a check is performed to determine whether the AP is transmitting frames, or whether the AP is receiving frames in order to differentiate between DL traffic and UL traffic respectively. The UL traffic can either be SU or trigger-based (TB). The TB PPDUs can use either UL MU-MIMO or UL MU-OFDMA or both together.

If operation 325 determines that the AP is receiving the frames, then the traffic is considered UL traffic. With UL traffic, the process 300 continues to operation 335 to begin the PPDU scheduling scheme this adapted for UL traffic (the right branch of the flow diagram). Alternatively, if the operation 325 determines that the AP is transmitting frames, then the traffic is considered DL traffic, and the process 300 continues to operation 330 to being the PPDU scheduling scheme for the DL traffic (the left branch of the flow diagram).

Referring to the case where DL traffic is determined at operation 325 (Shown as TX (DL)), the process 300 can then proceed to operation 326. At operation 326, a check is performed to determine whether the transmission, including DL traffic, is full bandwidth or partial bandwidth. In the case where the transmission is at full bandwidth, the process 300 continues to operation 330. For instance, a full bandwidth transmission is a SU or a full bandwidth MU-MIMO. Alternatively, if it is determined that the transmission is at partial bandwidth during the check operation 326, then the process 300 moves to operation 327. A partial bandwidth transmission can include MU-OFDMA or a partial bandwidth MU-MIMO.

By identifying that the transmission is at partial bandwidth, the PPDU scheduling scheme can leverage the available bandwidth. Particularly, at operation 327, the affected RUs can be assigned to client(s) that already have sufficient SNR. If there are no clients that have sufficient SNR, then the transmission (TX) rate can be adjusted to a lower value, and/or the TX power can be increased for the affected RUs at operation 327. Next, at operation 328, a check is performed to determine whether performance has been improved as a result of taking the actions in previous operation 327. If operation 328 determines that the performance has been appropriately improved (shown as "Yes"), then process 300 can continue to operation 329 to end the process 300, or return back to operation 305 to re-start the process in an iterative manner. However, if operation 328 determines that the performance has not been improved after completing previous operation 327 (shown as "No"), then process 300 proceeds to operation 341.

At operation 341, transmission (TX) beamforming is applied for at least the affected RUs so that antenna weights adapt to filter attenuation. After the TX beamforming is performed in operation 341, yet another check is performed at operation 342 to determine whether the performance has been improved as a result of taking the actions in previous operation 341. If operation 342 determines that the performance has been appropriately improved (shown as "Yes"), then process 300 can continue to operation 343 to end the process 300, or return back to operation 305 to re-start the process in an iterative manner. However, if operation 342 determines that the performance has not been improved after completing previous operation 341 (shown as "No"), then process 300 proceeds to operation 344.

Subsequently, at operation 344, RUs can be assigned to client(s) that have a high enough SNR for the preamble from the transmission to be reliably detected. These assigned RUs are from a subchannel that contains the affected RUs. After the RUs are assigned in operation 344, yet another check is performed at operation 345 to determine whether the performance has been improved. If operation 345 determines that the performance has been appropriately improved (shown as "Yes"), then process 300 can continue to operation 346 to end the process 300, or return back to operation 305 to re-start the process in an iterative manner. However, if operation 345 determines that the performance has not been improved by previous operation 344 (shown as "NO"), then process 300 proceeds to operation 347.

A check is conducted, at operation 347, to determine whether preamble puncturing is enabled. In the case where preamble puncturing is enabled, then this technique can be appropriately applied by the PPDU scheduling scheme in operation 348. Preamble puncturing allows the AP to avoid transmissions on one or more of the secondary subchannels, and provides a mechanism which allows the receiver to avoid using the punctured subchannel for reception. Since preamble puncturing applies only to secondary subchannels, operation 348 can also involve the AP first ensuring that its primary subchannel is not at the start or end of the channel since the subchannels at the start/end of the channel are the ones containing the RU(s) that are attenuated; and change the primary subchannel using standard techniques in case it is the edge subchannel.

Particularly, at operation 348, preamble puncturing is performed (e.g., by the AP) such that the subchannel to which the attenuated RUs belong are punctured. Preamble puncturing is performed for MU PPDUs as per 802.11ax standard by programming the HE-SIG-A1 field; and indicating which RUs to puncture by programming the RU Allocation subfield in the HE-SIG-B field. For MU-MIMO, preamble puncturing can be implemented by programming the Disallowed Subchannel Bitmap subfield of the NDP Announcement frame, so that the clients provide feedback only for the subchannels that are not punctured. By using preamble puncturing, transmissions on the attenuated subchannels will be avoided, thereby reduce bandwidth, and transmitting the DL traffic in a manner that compensates for the attenuation.

In the case where preamble puncturing is not enabled, the process 300 cannot employ preamble puncturing in the transmission. Thus, the process 300 does not perform preamble puncturing, and instead moves to operation 390 where another PPDU scheduling technique is applied. Operation 390 is discussed in further detail below.

Returning back to operation 326, in the case that the check determines that the transmission is full bandwidth, then the process 300 goes through another branch of the flow, beginning at operation 330. For DL traffic, the particular PPDU scheduling scheme that is applied can mitigate attenuation by increasing a signal-to-noise ratio (SNR) and/or reducing the physical transmission rate of the traffic which would allow the use of a more robust modulation scheme. As shown, operation 330 involves adjusting the transmission rate to a lower value and/or increase the transmission power to increase the SNR for all of the RUs or subcarriers. In other words, at operation 330, the transmission power for the PPDU is increased so as to increase the net SNR, which can lead to better decoding of the symbols. Alternatively, or in addition to increasing the transmission power, operation 330 can involve reducing the modulation and coding scheme (MCS) rate used for the transmission by the AP. By lowering the transmission rate, a more robust modulation scheme can ensure that subframe errors (otherwise caused by attenuation) are avoided.

Incrementing the transmission power within the required limits may allow the scheme to avoid reducing the MCS rate to substantially lower value, and as a result potentially achieving optimal performance. The increased SNR and/or reduced transmission rate can be applied for HE SU PPDUs, as well as HEMU PPDUs (OFDMA as well as MIMO). In the case of MU-OFDMA, the techniques in operation 330 can be limited to only the edge RUs (or subcarriers) that are attenuated. For DL-OFDMA transmissions, the attenuated RUs can be assigned to client(s) that are known to have a higher SNR. For example, dropping from 40 dB SNR to a 34 dB SNR may still result in an adequate MCS for successful transmission of traffic. Therefore, the selected client can use this attenuated RU based on the SNR and number of bytes. As an example, the client can have a short packet of 100 bytes and 40 dB SNR, thus using a lower MCS would not significantly affect its performance.

Thereafter, the process 300 can continue to operation 340 which checks whether the performance was improved by increasing the SNR and/or reducing the transmission rate at previous operation 330. In the case where operation 340 determines that the performance was improved (shown as "Yes"), this can serve as an indication that the attenuation was successfully corrected. As a result, process 300 can move to operation 331 to end the process 300, or return back to operation 305 to re-start the process in an iterative manner.

Otherwise, if operation 340 determines that the performance was not improved (shown as "No") then the process 300 can apply another PPDU scheduling technique to the DL traffic, namely transmit beamforming (TXBF), in operation 360. At operation 360, transmit beamforming is applied for antenna weights to adapt to the filter's attenuation. Filter attenuation can be considered similar to frequency selective fading (with the exception being that the attenuation is on all transmission-receiving (Tx-Rx) paths and we would not get diversity gain at the receiver to mitigate it). Therefore, transmit beamforming can be applied to all transmissions (including SU) from the AP since the sounding process of transmit beamforming will provide a feedback from the client that will incorporate the effect of the attenuation for the Tx-Rx paths. The antenna weights that will be obtained as a result of the beamforming process will adapt to the filter attenuation and thus improve the reception of the symbols on the attenuated RU(s). This technique can be applied for HE SU PPDUs as well as full or partial bandwidth HE MU-MIMO PPDUs. Transmit beamforming can also be applicable in cases where both OFDMA and MIMO are used in combination.

Next, the process 300 can continue to operation 365 which checks whether the performance was improved by the transmit beamforming at previous operation 360. In the case where operation 365 determines that the performance was improved (shown as "Yes"), this can serve as an indication that the attenuation was successfully corrected. As a result, process 300 can move to operation 361 to end the process 300, or return back to operation 305 to re-start the process in an iterative manner.

Alternatively, if operation 365 determines that the performance was not improved (shown as "No") then the process 300 can apply yet another PPDU scheduling technique to the DL traffic. As disclosed, the PPDU scheduling techniques may be further tuned in order to apply a specific scheme to SU or MU frames in the DL traffic. Accordingly, operation 385 determines whether the transmission is SU or MU (e.g., OFDMA or MIMO). Based on this determination, the process 300 can go on to either utilize pre-amble puncturing (on MU frames) or to reduce bandwidth for the transmission (on SU frames).

In the case where the DL traffic is detected as SU in operation 385 (shown as "SU"), the process 300 moves to operation 390. At operation 390, the bandwidth for the transmission of the SU frames in the DL traffic is reduced. Operation 390 can involve dynamically reduce the bandwidth of the PPDU to a width lower than the channel width of the client. According to some embodiments, the bandwidth can be reduced to the primary half of the channel width.

On the other hand, in the case where MU frames are detected in operation 385 (shown as "MU"), the process 300 moves operation 395. At operation 395, a check is performed to determine whether preamble puncturing is indeed enabled, prior to applying this technique to the DL traffic. For MU transmissions from the AP on the DL, preamble puncturing, which is a feature included in the 802.11ax standard, can be leveraged. The determination in operation 395 can be based on examining the settings of a Punctured Sounding Support bit in the HE MAC capabilities of the client and/or the Punctured Preamble RX field of the HE PHY capabilities of the client. If preamble puncturing is not enabled (shown as "No"), as determined by operation 395, then preamble puncturing cannot be utilized. As a consequence, the process 300 can go to operation 390 which dynamically reduces the bandwidth of the PPDU to a width lower than the channel width of the client (in manner similar to the bandwidth reduction applied to SU frames). The process 300 can then go to operation 391 to end the process 300, or return back to operation 305 to re-start the process in an iterative manner.

Subsequently, after bandwidth reduction is performed on the DL traffic as a last PPDU scheduling technique, the process 300 can end at operation 397.

Referring back to the case where UL traffic is determined at operation 325, the process 300 can then proceed to operation 335. The UL traffic can either be non-trigger-based, such as SU, or trigger-based (TB) MU. In most cases, HE TB PPDUs can use either UL MU-MIMO or UL MU-OFDMA or both in combination. As alluded to above, the disclosed PPDU scheduling techniques can be tuned such that a particular scheme is applied to trigger based (e.g., MU) frames and another scheme can be applied to non-trigger based (e.g., SU frames), which optimizes the PPDU scheduling scheme to the type of traffic being communicated. Thus, operation 335 is a check that determines whether the UL traffic is non trigger based (e.g., SU) frames or trigger-based (e.g., MU) frames. Generally, when operation 335 determines non trigger based frames of the UL traffic, then process 300 can limit the bandwidth as the PPDU scheduling scheme. Alternatively, when operation 335 determines trigger based frames in the UL traffic, the process 300 can increase the SNR and/or reduce the transmission rate.

If operation 335 determines trigger based frames in the UL traffic (shown as "TB") the process 300 proceeds to operation 350, where increasing the SNR and/or reducing the transmission rate is applied. As seen, operation 350 can involve allocating the attenuated RUs to clients with higher SNRs. In the case of trigger frames, operation 350 can include programming a higher value in the UL Target RSSI subfield and/or a lower rate in the UL HE MCS subfield for the clients with higher SNRs. Increasing SNR and/or reducing transmission rate for TB MU PPDUs can be accomplished in operation 330 by programming a higher value for the UL target RSSI subfield in the Basic Trigger frame. Alternatively or in addition to, operation 350 can also involve programming a lower rate in the UL HE MCS subfield of the Basic Trigger frame. The objective is to achieve the same end-effect of the SNR and rate as previously explained for the case of DL traffic.

Next, the process 300 can continue to operation 375 which checks whether the performance was improved by increasing SNR and/or reducing the transmission rate at previous operation 350. In the case where operation 375 determines that the performance was improved (shown as "Yes"), this can serve as an indication that the attenuation was successfully corrected. As a result, process 300 can move to operation 376 to end the process 300, or return back to operation 305 to re-start the process in an iterative manner.

Otherwise, in the case where operation 375 determines that the performance was not improved (shown as "No"), this may be indicative of the that PPDU scheduling scheme applied in operation 350 did not compensate for the attenuation, and performance remains negatively impacted. Consequently, the process 300 continues to operation 370 in order to apply yet another PPDU scheduling scheme to the UL traffic to address the attenuation.

At operation 377, RUs that have a high enough SNR for the preamble from the transmission to be reliably detected are assigned to clients. These RUs are particularly assigned from the subchannel that contains the affected RUs.

Again, the process 300 checks whether the performance was improved at operation 378. In the case where operation 378 determines that the performance was improved (shown as "Yes"), this can serve as an indication that the attenuation was successfully corrected by the actions of operation 377. As a result, process 300 can move to operation 379 to end the process 300, or return back to operation 305 to re-start the process in an iterative manner.

Otherwise, in the case where operation 378 determines that the performance was not improved (shown as "No"), this may be indicative of the that PPDU scheduling scheme applied in operation 350 did not compensate for the attenuation, and performance remains negatively impacted. Consequently, the process 300 continues to operation 380 in order to apply yet another PPDU scheduling scheme to the UL traffic to address the attenuation, namely bandwidth reduction.

Thereafter, at operation 380, the process 300 can avoid using the attenuated RUs by blocking, or otherwise completely dropping them. For instance, the attenuated RUs can be allocated to a reserved value of A1D12 in the target frame (corresponding to the attenuated RUs), or the UL bandwidth subfield may be programmed to use less bandwidth than the channel width, both effectively dropping the attenuated RUs. In other words, if programming the rate and UL RSSI of the TB MU frames in UL traffic does not help with reducing the PER and improving the performance (operation 350), then operation 380 can apply a more brute force approach that restricts the usage the RUs that are suffering attenuation. In some embodiments, programming the AID12 subfield involves programming the subfield for the RUs in the Basic Trigger to a reserved value (for example, any value between 2008-2044 or 2047-4094) that does not correspond to the association ID (AID) of any of the associated clients. Alternatively, operation 380 can involve restricting the bandwidth for the MU PPDU in the UL traffic to a lower width than the channel width of the client by programming a lower value in the UL BW subfield of the Basic Trigger frame. Restricting the bandwidth may be considered brute force, due to this approach reducing the overall bandwidth of the UL MU PPDU, but will be beneficial in case reserving the RUs by programming reserved AID12 values is not feasible due to interoperability reasons. The process 300 can then proceed from operation 380 to operation 397, thereby concluding the process 300.

Now, referring back to the case where non trigger based PPDUs in the UL traffic is determined at operation 335, the process 300 moves to operation 345. At operation 345, an impact of the UL rate adaption from the clients can be assessed. For example, for HE SU PPDUs, the AP monitors the subframe packet error rate (PER) and the rates utilized by rate-adaptation algorithm on the client side to ascertain if it chooses an appropriate transmission rate and/or transmission power to mitigate the symbol errors due to attenuated RUs.

Next, the process 300 can continue to operation 355 which checks whether the performance was improved based on the assessed UL rate adaptation in previous operation 345. In the case where operation 355 determines that the performance was improved (shown as "Yes"), this can serve as an indication that the attenuation was successfully corrected. As a result, process 300 can move to operation 346 to end the process 300, or return back to operation 305 to re-start the process in an iterative manner.

Otherwise, in the case where operation 355 determines that the performance was not improved (shown as "No"), this may be indicative of the that attenuation was not properly compensated, and there remains a negative impact on the performance. Consequently, the process 300 continues to operation 370 in order to apply yet another PPDU scheduling scheme to the UL traffic to address the attenuation.

Subsequently, at operation 370, an op-mode notification can be used to reduce the operating channel width to half, so that the attenuated RUs are avoided. For example, the SU PPDUs of UL traffic, can be limited to a bandwidth that is a lower width than the channel width by transmitting the OMN (Operating Mode Notification) action frame which will restrict the bandwidth for all PPDUs from that point onwards. As a consequence, the RUs outside of the adjusted bandwidth, and assuming that the affected RUs are in these edge bandwidths, will be dropped, thereby mitigating the negative effects of the attenuation. Subsequently, process 300 can end at operation 397.

It should be understood that the aforementioned PPDU scheduling techniques, as described in reference to FIG. 3, are applicable either on per-PPDU basis or can be reverted at any point in time without the clients losing connectivity or experiencing traffic interruptions.

In some embodiments, although not shown in FIG. 3, a PPDU scheduling technique can involve using edge RUs only for traffic belonging to access categories (ACs) that can sustain higher error rates, thus being capable of withstanding the degradation associated with attenuated RUs. For example, edge RUs can be assigned only to clients that have traffic on lower QoS ACs such as Best Effort (BE) and Background (BK) ACs. Further, the edge RUs may be avoided for clients that are transmitting traffic from higher QoS ACs such as Voice (VO) and/or Video (VI) ACs. In some embodiments, these PPDU scheduling techniques can be triggered-on or triggered-off dynamically based on the frequency shift, and can be terminated in response to determining that the temperature-sensitivity induced frequency response shift is no longer detected in the filters' operation (e.g., filters return to nominal operating temperature).

Although the abovementioned DPD and PPDU scheduling techniques as disclosed herein are applicable to all channel bandwidths for filter response compensation, a substantial impact will be seen in 160 MHz channels from a Wi-Fi-6 E perspective. As previously alluded to, 160 MHz channels (compared to lower bandwidths) will be transmitting at a high transmit power levels and can potentially allocate wider tone RUs to high throughput requirement clients. In some cases, the TCF characteristic of filters can shift the filter response in a range of 4 MHz-6 MHz over temperature extremes. This could severely restrict 160 MHz channel operation and hence force reduced throughput performance mode by using lower bandwidth channels. Such performance issues would become more apparent in the emerging Wi-Fi standards, such as the 802.11be standard which will allow bandwidths of 320 MHz. Thus, the advantages realized by the techniques and systems disclosed herein will mitigate these issues, having even greater returns in such Wi-Fi systems while providing flexible channel assignment and density.

Referring now to FIG. 4, a process 400 is shown that implements DPD and PPDU scheduling particularly to address shift of the rejection band. Generally, process 400 attempts to limit or eliminate the OOB emissions when the AP is transmitting. However, when the AP is receiving, the process 400 ensures that reception is not hindered by transmission in the neighboring channel(s). Thus, process 400 ultimately checks for whether the OOB transmissions are sufficiently reduced on the transmission (TX) branch (e.g., operations 453-475), versus checking for whether performance is improved for the receiving (RX) branch (e.g., operations 430-496).

Process 400 begins at operation 405. Subsequently, at operation 410, the PPDU scheduling process 400 can determine whether the filter response has shifted due to temperature changes. Detecting that there is temperature-sensitivity induced frequency response shift (shown as "Yes") can serve as an indication that there is some attenuation being experienced by some RUs, commonly by the RUs at the edges of the channel width. Thereafter, the PPDU scheduling process 400 can move to operation 415 to perform DPD techniques to attenuate the OOB emissions, thereby addressing shifting of the rejection band. The DPD techniques may be implemented via the radios (including front ends) described in detail above in reference to FIG. 1.

Alternatively, if operation 410 detects that there is no shifting in the filter's response (shown as "No"), then the process 400 can move to operation 411 and end the process 400, or return back to operation 405 to re-start the process in an iterative manner.

Continuing to operation 420, the process 400 can perform a check to determine whether the OOB RUs are sufficiently attenuated after DPD techniques have been employed. When the OOB RUs have not been appropriately attenuated by the DPD techniques, then the potential of issues, such as desensitization in a simultaneously operating adjacent channel, still exists. Accordingly, upon determining that the OOB RUs are not sufficiently attenuated in a manner that compensates for the shifting of the rejection band, then process 400 can continue to PPDU scheduling as a secondary approach (or failsafe) in order to correct for the filter's response shift that was not completely corrected by the DPD techniques.

Otherwise, if operation 410 determines that the OOB RUs have been properly attenuated, then this determination indicates that the DPD techniques of previous operation 415 has successfully compensated for the temperature-sensitivity induced frequency response shift. Thus, the process 400 can move to operation 421 and end the process 400, or return back to operation 405 to re-start the process in an iterative manner.

Generally, operation 425 can be considered as the start of the PPDU scheduling functions of the process 400. The disclosed PPDU scheduling techniques can be configured to apply a particular scheme based on the direction of traffic (e.g., whether it is transmitted or received by the AP). By adapting the scheme specifically for the traffic that is being communicated, the PPDU scheduling aspects of the process 400 can be used to optimize performance. A particular scheme can be applied for: 1) downlink traffic, for PPDUs transmitted by the AP; and 2) uplink traffic, for PPDUs received by the AP. As alluded to above, the process 400 generally aims to determine whether the OOB transmissions are sufficiently reduced during downlink (e.g., operations 453-475), versus checking for whether performance is improved during uplink (e.g., operations 430-496). Thus, at operation 425 a check is performed to determine whether the AP is transmitting frames, or whether the AP is receiving frames in order to differentiate between DL traffic and UL traffic respectively. The UL traffic can either be SU or trigger-based (TB). The TB PPDUs can use either UL MU-MIMO or UL MU-OFDMA or both together.

If operation 425 determines that the AP is receiving the frames, then the traffic is considered UL traffic. With UL traffic, the process 400 continues to operation 430 to begin the PPDU scheduling scheme this adapted for UL traffic (the right branch of the flow diagram). Alternatively, if the operation 425 determines that the AP is transmitting frames, then the traffic is considered DL traffic, and the process 400 continues to operation 435 to being the PPDU scheduling scheme for the DL traffic (the left branch of the flow diagram).

At operation 435, a check is performed to determine whether the transmission, including DL traffic, is full bandwidth or partial bandwidth. In the case where the transmission is at full bandwidth, the process 400 continues to operation 440. For instance, a full bandwidth transmission is a SU or a full bandwidth MU-MIMO. Alternatively, if it is determined that the transmission is at partial bandwidth during the check operation 435, then the process 400 moves to operation 451. A partial bandwidth transmission can include MU-OFDMA or a partial bandwidth MU-MIMO.

In the case where operation 435 determines that the transmission is at full bandwidth, then process 400 continues to operation 440. At operation 440, the transmission (TX) power for the edge subcarrier(s) can be lowered. In some cases, operation 440 can involve lowering the TX power for the entire channel width. After lowering the transmission power at operation 440, the process 400 goes to operation 445 to check the effectiveness of this approach.

Next, at operation 445, a check is performed to determine whether the OOB emissions are sufficiently attenuated by lowering the TX power during previous operation 440. If the OOB emissions are deemed to be not sufficiently attenuated at operation 445 (shown as "No"), then there is not enough compensation for shifting in the rejection band. Thus, the process 400 can perform yet another PPDU scheduling technique, at operation 450, in attempt to compensate for the rejection band shift. Alternatively, if operation 445 determines that the OOB RUs have been properly attenuated (shown as "Yes"), then this determination indicates that actions of previous operation 440 has successfully compensated for the rejection band shift. Thus, the process 400 can move to operation 446 and end the process 400, or return back to operation 405 to re-start the process in an iterative manner.

At operation 450, the bandwidth for the transmission to an unaffected part of the channel width is reduced. Operation 450 can involve ensuring that the primary subchannel is included in the unaffected part of the channel. Subsequently, the process 400 can move from operation 450 to operation 497, thus ending the process 400.

Now referring back to operation 435, when the check determines that the transmission is at partial bandwidth, then the process 400 continues to operation 451. The transmission (TX) power is lowered, but only for the edge RUs in particular, at operation 451.

Thereafter, at operation 455, a check is performed to determine whether the OOB emissions are sufficiently attenuated by lowering the TX power during previous operation 451. If the OOB emissions are deemed to be not sufficiently attenuated at operation 455 (shown as "No"), then there is not enough compensation for shifting in the rejection band. Thus, the process 400 can perform yet another PPDU scheduling technique, at operation 460, in attempt to compensate for the rejection band shift. Alternatively, if operation 455 determines that the OOB RUs have been properly attenuated, then this determination indicates that the actions of previous operation 451 have successfully compensated for the rejection band shift. Thus, the process 400 can move to operation 456 and end the process 400, or return back to operation 405 to re-start the process in an iterative manner.

Subsequently, at operation 460, RUs can be assigned to client(s) that have a high enough SNR for the preamble from the transmission to be reliably detected even when the TX power is further reduced. These assigned RUs are from a subchannel that contains the affected RUs. After the RUs are assigned in operation 360, yet another check is performed at operation 465 to determine whether the OOB emissions have been sufficiently attenuated. If operation 365 determines that the OOB emissions have been properly attenuated (shown as "Yes"), then process 400 can continue to operation 446 to end the process 400, or return back to operation 405 to re-start the process in an iterative manner. However, if operation 445 determines that the OOB emissions are not properly attenuated by previous operation 460 (shown as "NO"), then process 400 proceeds to operation 470.

A check is conducted, at operation 470, to determine whether preamble puncturing is enabled. In the case where preamble puncturing is enabled, then this technique can be appropriately applied by the PPDU scheduling scheme in operation 475. Preamble puncturing allows the AP to avoid transmissions on one or more of the secondary subchannels, and provides a mechanism which allows the receiver to avoid using the punctured subchannel for reception. Since preamble puncturing applies only to secondary subchannels, operation 475 can also involve the AP first ensuring that its primary subchannel is not at the start or end of the channel since the subchannels at the start/end of the channel are the ones containing the RU(s) that are attenuated; and change the primary subchannel using standard techniques in case it is the edge subchannel. After preamble puncturing is performed by operation 475, the process 400 can proceed to operation 497, thereby ending the process 400.

In the case where preamble puncturing is not enabled, the process 400 cannot employ preamble puncturing in the transmission. Thus, the process 400 does not perform preamble puncturing, and instead moves to operation 450 where another PPDU scheduling technique (i.e., reducing bandwidth to unaffected part of the channel), is applied.

Referring back to the case where UL traffic is determined at operation 425, the process 400 can then proceed to operation 430. The UL traffic can either be non-trigger-based (non TB), such as SU, or trigger-based (TB) MU. As alluded to above, the disclosed PPDU scheduling techniques can be tuned such that a particular scheme is applied to trigger-based (e.g., MU) frames and another scheme can be applied to non-trigger-based (e.g., SU) frames, which optimizes the PPDU scheduling scheme to the type of traffic being communicated. Thus, operation 430 is a check that determines whether the UL traffic is non-trigger-based (e.g., SU) frames or trigger-based (e.g., MU) frames. Generally, when operation 430 determines non-trigger-based frames of the UL traffic, then process 400 can limit the bandwidth as the PPDU scheduling scheme. Alternatively, when operation 430 determines trigger-based frames in the UL traffic, the process 400 can increase the SNR and/or reduce the transmission rate.

If operation 430 determines trigger-based frames in the UL traffic (shown as "TB") the process 400 proceeds to operation 436, where increasing the SNR and/or reducing the transmission rate is applied. As seen, operation 436 can involve allocating the attenuated RUs to clients with higher SNRs. In the case of trigger frames, operation 436 can include programming a higher value in the UL Target RSSI subfield and/or a lower rate in the UL HE MCS subfield for the clients with higher SNRs. Increasing SNR and/or reducing transmission rate for TB MU PPDUs can be accomplished in operation 436 by programming a higher value for the UL target RSSI subfield in the Basic Trigger frame. Alternatively or in addition to, operation 436 can also involve programming a lower rate in the UL HE MCS subfield of the Basic Trigger frame.

Next, the process 400 can continue to operation 491 which checks whether the performance was improved by increasing SNR and/or reducing the transmission rate at previous operation 436. In the case where operation 491 determines that the performance was improved (shown as "Yes"), this can serve as an indication that the attenuation was successfully corrected. As a result, process 400 can move to operation 492 to end the process 400, or return back to operation 405 to re-start the process in an iterative manner.

Otherwise, in the case where operation 491 determines that the performance was not improved (shown as "No"), this may be indicative of the that PPDU scheduling scheme applied in operation 436 did not compensate for the rejection band shifting, and performance remains negatively impacted. Consequently, the process 400 continues to operation 493 in order to apply yet another PPDU scheduling scheme to the UL traffic to address the attenuation.

At operation 493, RUs that have a high enough SNR for the preamble from the transmission to be reliably detected, even when the transmission (TX) power is further reduced, are assigned to clients. These RUs are particularly assigned from the subchannel that contains the affected RUs.

Again, the process 400 checks whether the performance was improved at operation 494. In the case where operation 494 determines that the performance was improved (shown as "Yes"), this can serve as an indication that the rejection band shift was successfully corrected by the actions of operation 493. As a result, process 400 can move to operation 495 to end the process 400, or return back to operation 405 to re-start the process in an iterative manner.

Otherwise, in the case where operation 400 determines that the performance was not improved (shown as "No"), this may be indicative of the that PPDU scheduling scheme applied in operation 493 did not compensate for the rejection band shift, and performance remains negatively impacted. Consequently, the process 400 continues to operation 496 in order to apply yet another PPDU scheduling scheme to the UL traffic to address the attenuation, namely bandwidth reduction.

Thereafter, at operation 496, the process 400 can avoid using the attenuated RUs by blocking, or otherwise completely dropping them. For instance, the attenuated RUs can be allocated to a reserved value of A1D12 in the target frame (corresponding to the attenuated RUs), or the UL bandwidth subfield may be programmed to use less bandwidth than the channel width, both effectively dropping the attenuated RUs. The process 400 can then proceed from operation 496 to operation 497, thereby concluding the process 400.

Now, referring back to the case where non-trigger-based PPDUs in the UL traffic is determined at operation 430, the process 400 moves to operation 480. At operation 380, an impact of the UL rate adaption from the clients can be assessed. For example, for HE SU PPDUs, the AP monitors the subframe packet error rate (PER) and the rates utilized by rate-adaptation algorithm on the client side to ascertain if it chooses an appropriate transmission rate and/or transmission power to mitigate the symbol errors due to attenuated RUs.

Next, the process 400 can continue to operation 485 which checks whether the performance was improved based on the assessed UL rate adaptation in previous operation 480. In the case where operation 485 determines that the performance was improved (shown as "Yes"), this can serve as an indication that the attenuation was successfully corrected. As a result, process 400 can move to operation 486 to end the process 400, or return back to operation 405 to re-start the process in an iterative manner.

Otherwise, in the case where operation 485 determines that the performance was not improved (shown as "No"), this may be indicative of the that rejection band shift was not properly compensated, and there remains a negative impact on the performance. Consequently, the process 400 continues to operation 490 in order to apply yet another PPDU scheduling scheme to the UL traffic to address the attenuation.

Subsequently, at operation 490, an op-mode notification can be used to reduce the operating channel width, so that the attenuated RUs are avoided. For example, the SU PPDUs of UL traffic, can be limited to a bandwidth that is a lower width than the channel width by transmitting the OMN (Operating Mode Notification) action frame which will restrict the bandwidth for all PPDUs from that point onwards. As a consequence, the RUs outside of the adjusted bandwidth, will be dropped. Subsequently, process 400 can end at operation 497.

Figure 5:
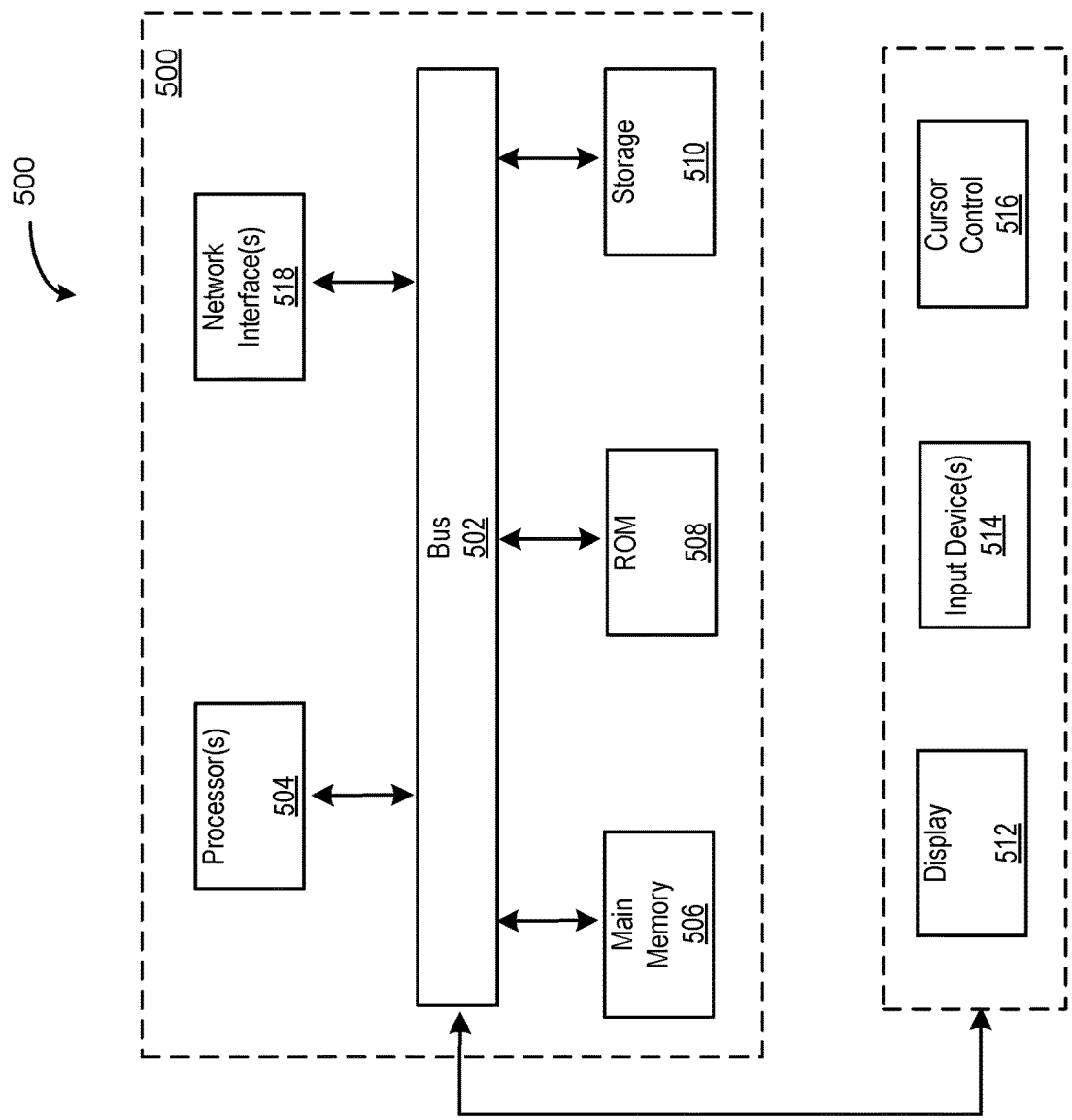
FIG. 5 illustrates an example computer system that may be used in implementing filter frequency response compensation in relating to the embodiments of the disclosed technology.

FIG. 5 depicts a block diagram of an example computer system 500 in which embodiments described herein may be implemented. The computer system 500 includes a bus 502 or other communication mechanism for communicating information, one or more hardware processors 504 coupled with bus 502 for processing information. Hardware processor(s) 504 may be, for example, one or more general purpose microprocessors.

The computer system 500 also includes a main memory 506, such as a random access memory (RAM), cache and/or other dynamic storage devices, coupled to bus 502 for storing information and instructions to be executed by processor 504. Main memory 506 also may be used for storing temporary variables or other intermediate information during execution of instructions to be executed by processor 504. Such instructions, when stored in storage media accessible to processor 504, render computer system 500 into a special-purpose machine that is customized to perform the operations specified in the instructions.

The computer system 500 further includes a read only memory (ROM) 508 or other static storage device coupled to bus 502 for storing static information and instructions for processor 504. A storage device 510, such as a magnetic disk, optical disk, or USB thumb drive (Flash drive), etc., is provided and coupled to bus 502 for storing information and instructions.

The computer system 500 may be coupled via bus 502 to a display 512, such as a liquid crystal display (LCD) (or touch screen), for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. In some embodiments, the same direction information and command selections as cursor control may be implemented via receiving touches on a touch screen without a cursor.

The computing system 500 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to processor(s) 504 executing one or more sequences of one or more instructions contained in main memory 506. Such instructions may be read into main memory 506 from another storage medium, such as storage device 510. Execution of the sequences of instructions contained in main memory 506 causes processor(s) 504 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 510. Volatile media includes dynamic memory, such as main memory 506. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 502. Transmission media can also take the form of acoustic or light waves, such as those generated during radio-wave and infra-red data communications.

The computer system 500 also includes a communication interface 518 coupled to bus 502. Network interface 518 provides a two-way data communication coupling to one or more network links that are connected to one or more local networks. For example, communication interface 518 may be an integrated services digital network (ISDN) card, cable modem, satellite modem, or a modem to provide a data communication connection to a corresponding type of telephone line. As another example, network interface 518 may be a local area network (LAN) card to provide a data communication connection to a compatible LAN (or WAN component to communicated with a WAN). Wireless links may also be implemented. In any such implementation, network interface 518 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 518, which carry the digital data to and from computer system 500, are example forms of transmission media.

The computer system 500 can send messages and receive data, including program code, through the network(s), network link and communication interface 518. In the Internet example, a server might transmit a requested code for an application program through the Internet, the ISP, the local network and the communication interface 518.

The received code may be executed by processor 504 as it is received, and/or stored in storage device 510, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 500.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A method comprising:
    determining whether a frequency response of a filter has shifted, wherein the filter is a component of a network device for communicating data frames in a wireless network;
    in response to determining that the frequency response of the filter has shifted, applying a digital pre-distortion to a signal input into the filter to compensate for the shift in the frequency response;
    determining whether the digital pre-distortion has compensated for the shift in the frequency response of the filter; and
    in response to determining that the digital pre-distortion has not compensated for the shift in the frequency response of the filter, applying at least one PHY Protocol Data Unit (PPDU) scheduling scheme to the data frames communicated by the network device.

2. A network device, comprising:
    a first radio;
    a second radio, wherein the first radio and the second radio are collocated and operating in differing Wi-Fi bands;
    a first front end coupled to the first radio; and
    a second front end coupled to the second radio, wherein each of the first front end and the second front end includes circuitry which comprises:
        one or more filters enabling frequency domain coexistence between the first radio and the second radio operating in the differing Wi-Fi bands; and
        a coupler allowing feedback to the respective first radio or second radio, the feedback associated with a digital pre-distortion applied by the respective first radio or second radio to a signal input into the one or more filters, wherein the digital pre-distortion compensates for a temperature-sensitivity induced shift in the frequency response of the one or more filters.

3. The network device of claim 2, further comprising:
    one or more processors; and
    a non-transitory computer-readable storage medium having stored thereon executable computer program instructions that, when executed by the one or more processors, cause the one or more processors to perform operations comprising:

determining an amount of the temperature-sensitivity induced shift in the frequency response based on a Temperature Coefficient of Frequency (TCF) associated with the one or more filters; and determining an amount of pre-amplification to be applied by the first radio or the second radio to compensate for a determined amount of attenuation due to the temperature-sensitivity induced shift in the frequency response.

4. The network device of claim 3, wherein the one or more filters enable the frequency domain coexistence by splitting interfering passbands in a 5 GHz and a 6 GHz Wi-Fi bands into narrow sub-bands and wherein the first radio and the second radio compensate for the temperature-sensitivity induced shift in the frequency response impacting the narrow sub-bands.

5. The network device of claim 3, wherein the network device is a wireless access point (WAP).

6. A non-transitory computer-readable storage medium having stored thereon executable computer program instructions that, when executed by one or more processors, cause the one or more processors to perform operations comprising:

determining whether a frequency response of a filter has shifted, wherein the filter is a component of a network device for communicating data frames in a wireless network;

in response to determining that the frequency response of the filter has shifted, applying a digital pre-distortion to a signal input into the filter to compensate for the shift in the frequency response;

determining whether the digital pre-distortion has compensated for the shift in the frequency response of the filter; and in response to determining that the digital pre-distortion has not compensated for the shift in the frequency response of the filter, applying at least one PHY Protocol Data Unit (PPDU) scheduling scheme to the data frames communicated by the network device.

7. The non-transitory computer-readable storage medium of claim 6, wherein the shift in the frequency response is associated with an attenuation of resource units within the passband of the filter, and wherein the digital pre-distortion applies an amplification to the attenuated resource units such that the amplification compensates for the attenuation.

8. The non-transitory computer-readable storage medium of claim 7, wherein the one or more processors perform further operations comprising:

determining whether the data frames communicated by the network device are associated with uplink traffic or downlink traffic;

in response to determining the downlink traffic, determining whether a transmission associated with the downlink traffic is at partial bandwidth or at full bandwidth;

in response to determining that the transmission associated with the downlink traffic is at the full bandwidth, performing an action comprising at least one of: adjusting a transmission rate to a lower value, increasing a transmission power for an entire channel width, and increasing the transmission power for affected subcarriers; and determining whether a performance is improved by performing the action.

9. The non-transitory computer-readable storage medium of claim 8, wherein the one or more processors perform further operations comprising:

in response to determining that the performance is not improved by performing the action, applying transmit (TX) beamforming for antenna weights to compensate for the attenuation; and determining whether performance is improved by applying the TX beamforming.

10. The non-transitory computer-readable storage medium of claim 9, wherein the one or more processors perform further operations comprising:

in response to determining that the performance is not improved by applying the TX beamforming, reducing a bandwidth used for transmission to an unaffected part of the entire channel width, wherein the unaffected part of the entire channel width includes a primary subchannel.

11. The non-transitory computer-readable storage medium of claim 8, wherein the one or more processors perform further operations comprising:

in response to determining that the transmission associated with the downlink traffic is at the partial bandwidth, determining whether a client has a sufficient signal noise ratio (SNR);

in response to determining that the client has the sufficient SNR, assigning affected resource units to the client;

in response to determining that no client has the sufficient SNR, performing at least one of: adjusting the transmission rate to the lower value, and increasing the transmission power for the affected resource units; and determining whether the performance is improved by performing the action.

12. The non-transitory computer-readable storage medium of claim 11, wherein the one or more processors perform further operations comprising:

in response to determining that the performance is not improved by the action, applying transmit (TX) beamforming for at least the affected resource units for antenna weights to compensate for the attenuation; and determining whether the performance is improved by applying the TX beamforming.

13. The non-transitory computer-readable storage medium of claim 12, wherein the one or more processors perform further operations comprising:

in response to determining that performance is not improved by applying the TX beamforming, assigning other resource units to clients that have the sufficient SNR for a preamble from the transmission to be reliably detected, wherein the other resource units are from a subchannel including the affected resource units; and determining whether the performance is improved by assigning the other resource units to the clients that have the sufficient SNR.

14. The non-transitory computer-readable storage medium of claim 13, wherein the one or more processors perform further operations comprising:

in response to determining that the performance is not improved by assigning the other resource units to the clients that have the sufficient SNR, determining whether preamble puncturing is enabled; and in response to determining that the preamble puncturing is enabled, determining whether the subchannel including the attenuated resource units is a primary subchannel.

15. The non-transitory computer-readable storage medium of claim 14, wherein the one or more processors perform further operations comprising:
in response to determining that the subchannel including the attenuated resource units is the primary subchannel, changing the primary subchannel to another available subchannel; and
puncturing the subchannel including the attenuated resource units.

16. The non-transitory computer-readable storage medium of claim 14, wherein the one or more processors perform further operations comprising:
in response to determining that the subchannel including the attenuated resource units is not the primary subchannel, puncturing the subchannel including the attenuated resource units.

17. The non-transitory computer-readable storage medium of claim 8, wherein the one or more processors perform further operations comprising:
in response to determining that the data frames communicated by the network device are associated with the uplink traffic, determining whether the uplink traffic comprises trigger-based PPDUs or non-trigger-based PPDUs;
in response to determining that the uplink traffic comprises the trigger-based PPDUs, allocating affected resource units to clients associated with higher signal-to-noise ratios (SNRs);
in response to allocating the affected resource units to the clients associated with the higher SNRs, determining whether the performance is improved; and
in response to determining that the performance is not improved, assigning resource units from a subchannel that includes the affected resource units to the clients, wherein the assigned resource units are determined to have a signal-to-noise ratio (SNR) such that a preamble from the transmission of the uplink traffic remains detectable by an access point.

18. The non-transitory computer-readable storage medium of claim 17, wherein allocating the affected resource units to the clients associated with the higher SNRs further comprises at least one of: programming a higher value for target Received Signal Strength Indicator (RSSI), and programming a lower rate for the clients associated with the higher SNRs.

19. The non-transitory computer-readable storage medium of claim 17, wherein the one or more processors perform further operations comprising:
in response to assigning the resource units from the subchannel that includes the affected resource units to the clients, determining whether the performance is improved; and
in response to determining that the performance is not improved, blocking the attenuated resource units in a trigger frame of the trigger-based PPDUs or reducing a bandwidth used for transmission to less than the entire channel width.

20. The non-transitory computer-readable storage medium of claim 17, wherein the one or more processors perform further operations comprising:
in response to determining that the uplink traffic comprises the non-trigger-based PPDUs, assessing an impact of an uplink rate adaptation from the clients;
in response to assessing the impact of the uplink rate adaptation from the clients, determining whether performance is improved by the uplink rate adaptation; and
in response to determining that performance is not improved by the uplink rate adaptation, reducing operating channel width.

* * * * *